(12) United States Patent
Urbanus et al.

(10) Patent No.: US 9,355,751 B2
(45) Date of Patent: May 31, 2016

(54) MULTI-ELECTRODE STACK ARRANGEMENT

(71) Applicant: MAPPER LITHOGRAPHY IP B.V., Delft (NL)

(72) Inventors: Willem Henk Urbanus, Delft (NL); Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/541,238

(22) Filed: Nov. 14, 2014

(65) Prior Publication Data
US 2015/0137010 A1 May 21, 2015

Related U.S. Application Data

(60) Provisional application No. 61/904,057, filed on Nov. 14, 2013.

(51) Int. Cl.
*G21K 1/02* (2006.01)
*G21K 5/04* (2006.01)
(Continued)

(52) U.S. Cl.
CPC .. *G21K 1/02* (2013.01); *G21K 5/04* (2013.01); *H01J 37/026* (2013.01); *H01J 37/065* (2013.01); *H01J 37/12* (2013.01); *H01J 37/16* (2013.01); *H01J 37/24* (2013.01); *H01J 37/3002* (2013.01); *H01J 37/3007* (2013.01);
(Continued)

(58) Field of Classification Search
CPC ..... H01J 37/026; H01J 37/12; H01J 37/3007; H01J 37/3171; H01J 37/065; H01J 37/153; H01J 37/16; H01J 37/24; H01J 37/3002; H01J 37/3174; H01J 37/3175; B01J 19/088

USPC ........ 250/396 R, 396 ML, 505.1, 363.1, 398, 250/492.1, 492.2, 503.1; 378/149; 422/186.04

See application file for complete search history.

(56) References Cited

U.S. PATENT DOCUMENTS 3,688,203 A * 8/1972 Harrison ....................... 250/398
3,702,951 A 11/1972 Kosmahl
(Continued)

FOREIGN PATENT DOCUMENTS

JP H 2215099 8/1990
JP H 11149882 6/1999
(Continued)

*Primary Examiner* — David A Vanore
(74) *Attorney, Agent, or Firm* — Hoyng Rock Monegier LLP; David P. Owen

(57) ABSTRACT

The invention relates to an electrode stack (70) comprising stacked electrodes (71-80) for manipulating a charged particle beam along an optical axis (A). Each electrode comprises an electrode body with an aperture for the charged particle beam. The electrode bodies are mutually spaced and the electrode apertures are coaxially aligned along the optical axis. The electrode stack comprises electrically insulating spacing structures (89) between each pair of adjacent electrodes for positioning the electrodes (71-80) at predetermined mutual distances along the axial direction (Z). A first electrode and a second electrode each comprise an electrode body with one or more support portions (86), wherein each support portion is configured to accommodate at least one spacing structure (89). The electrode stack has at least one clamping member (91-91c) configured to hold the support portions (86) of the first and second electrodes, as well as the intermediate spacing structure (89) together.

27 Claims, 15 Drawing Sheets

(51) Int. Cl.
  *H01J 37/24* (2006.01)
  *H01J 37/30* (2006.01)
  *H01J 37/317* (2006.01)
  *H01J 37/02* (2006.01)
  *H01J 37/16* (2006.01)
  *H01J 37/065* (2006.01)
  *H01J 37/12* (2006.01)

(52) U.S. Cl.
  CPC ........ *H01J 37/3174* (2013.01); *H01J 37/3175* (2013.01); *H01J 2237/002* (2013.01); *H01J 2237/04* (2013.01); *H01J 2237/1215* (2013.01); *H01J 2237/16* (2013.01); *H01J 2237/303* (2013.01); *H01J 2237/30472* (2013.01); *H01J 2237/3173* (2013.01)

(56) References Cited

U.S. PATENT DOCUMENTS

| | | | | |
|---|---|---|---|---|
| 3,958,714 | A * | 5/1976 | Barriere et al. | 220/592.2 |
| 4,182,927 | A * | 1/1980 | Phillips | 373/99 |
| 4,419,585 | A * | 12/1983 | Strauss et al. | 250/505.1 |
| 4,606,892 | A * | 8/1986 | Bachhofer et al. | 422/186.2 |
| 5,134,301 | A * | 7/1992 | Kamata et al. | 250/492.2 |
| 5,270,549 | A * | 12/1993 | Engdahl | 250/505.1 |
| 5,298,757 | A * | 3/1994 | Okayama | 250/396 R |
| 5,847,494 | A * | 12/1998 | Bayliss et al. | 313/231.31 |
| 6,066,927 | A | 5/2000 | Koudijs | |
| 6,185,278 | B1 * | 2/2001 | Appleby et al. | 378/149 |
| 6,334,982 | B1 * | 1/2002 | Carlow et al. | 422/186.04 |
| 6,617,595 | B1 | 9/2003 | Okunuki | |
| 6,914,249 | B2 * | 7/2005 | Kienzle et al. | 250/396 R |
| 7,514,676 | B1 * | 4/2009 | Page et al. | 250/288 |
| 8,217,359 | B1 * | 7/2012 | Kross et al. | 250/370.09 |
| 8,368,015 | B2 * | 2/2013 | Platzgummer et al. | 250/306 |
| 8,642,955 | B2 * | 2/2014 | Austin et al. | 250/292 |
| 8,669,534 | B2 | 3/2014 | Onoguchi et al. | |
| 2002/0131918 | A1 * | 9/2002 | Nelson et al. | 422/186.04 |
| 2004/0036029 | A1 * | 2/2004 | Bertsch | 250/396 R |
| 2004/0105160 | A1 * | 6/2004 | Kienzle et al. | 359/619 |
| 2005/0077475 | A1 | 4/2005 | Nagae et al. | |
| 2007/0034810 | A1 * | 2/2007 | Hoyes | 250/396 R |
| 2010/0038456 | A1 * | 2/2010 | Hamann et al. | 239/533.2 |
| 2011/0081004 | A1 * | 4/2011 | Harding et al. | 378/147 |
| 2011/0180704 | A1 * | 7/2011 | Green et al. | 250/282 |
| 2012/0273690 | A1 | 11/2012 | Wieland et al. | |
| 2012/0293780 | A1 | 11/2012 | Dinu-Gurtler et al. | |
| 2014/0119508 | A1 * | 5/2014 | Kang et al. | 378/62 |
| 2014/0224999 | A1 * | 8/2014 | Noguchi | 250/396 R |
| 2015/0028197 | A1 * | 1/2015 | Grinfeld et al. | 250/282 |
| 2015/0077831 | A1 * | 3/2015 | Friedman et al. | 359/275 |

FOREIGN PATENT DOCUMENTS

| | | |
|---|---|---|
| JP | 2001 118491 | 4/2001 |
| JP | 2001 281398 | 10/2001 |
| JP | 2003 045789 | 2/2003 |
| JP | 2004 055166 | 2/2004 |
| JP | 2009 119504 | 6/2009 |
| WO | WO 2013 142068 A1 | 9/2013 |

* cited by examiner

MULTI-ELECTRODE STACK ARRANGEMENT

TECHNICAL FIELD

The invention relates generally to an electrode stack, to a charged particle beam generator, and to a charged particle lithography system.
Furthermore, the invention relates to an electrode for use in the electrode stack.

BACKGROUND

In the semiconductor industry, an ever-increasing desire exists to manufacture smaller structures with high accuracy and reliability. Lithography is a critical part of such manufacturing process. In a mask-less lithography system, charged particle beamlets may be used to transfer a pattern onto a target. The beamlets may be individually controllable to obtain the desired pattern.

To be commercially viable, the charged particle lithography systems need to be able to meet challenging demands for substantial wafer throughput and stringent error margins. A higher throughput may be obtained by using more beamlets, and hence more current.

However, the handling of a greater number of beamlets results in the need for more control circuitry. The operational control circuitry may cause heating within the lithography system. Furthermore, an increase in the current results in more charged particles that interact with components in the lithography system. The collisions between charged particles and system components inside the lithography system may cause significant heating of respective components. The resulting heating of beam manipulation components may lead to thermal deformations that reduce the accuracy of the lithography process.

The use of a large number of beamlets further increases the risk of unacceptable inaccuracy due to inter-particle interactions between the beamlets (e.g. Coulomb interactions).

The effects of inter-particle interactions may be reduced by shortening the path between particle source and target. Path shortening may be achieved by using stronger electric fields for manipulating the charged particles, which requires application of larger electric potential differences between various electrodes in the charged particle lithography system.

With stronger electric fields present, mechanical misalignments in the particle source, the field electrodes, and other beam manipulation elements (e.g. misalignment resulting from mechanical resonances) will have a larger impact on the field accuracy, and hence on the beam processing accuracy.

Also, with stronger electric fields, any temporary changes in the geometrical configuration of the beam manipulation elements increases the risk of electric discharge, which can have detrimental consequences for the system's structural integrity and achievable accuracy.

SUMMARY OF THE INVENTION

It would be desirable to provide a charged particle beam generator and lithography system, as well as components thereof, which allow the use of a great number of charged particle beamlets while providing high mechanical stability, even under strong electric field conditions.

Therefore, according to a first aspect, there is provided an electrode stack, comprising: —a plurality of stacked electrodes for manipulating a charged particle beam along an optical axis, wherein each electrode comprises an electrode body with an electrode aperture for permitting passage of the charged particle beam, wherein the electrode bodies are mutually spaced along an axial direction that is substantially parallel with the optical axis, and wherein the electrode apertures are coaxially aligned along the optical axis, —and spacing structures essentially consisting of an electrically insulating material, and arranged between each pair of adjacent electrodes for positioning the electrodes at predetermined mutual distances along the axial direction. A first electrode and a second electrode (71-80) each comprise an electrode body with one or more support portions. Each support portion is configured to accommodate at least one spacing structure. The electrode stack is formed with at least one clamping member that is configured for holding together the respective support portions of the first and second electrodes, with the at least one spacing structure located in between.

Cylindrical coordinates are used herein to describe spatial relations of the charged particle beam generator. The macroscopic direction of the flow of charged particles is referred to as "axial direction" Z'. The term "upstream" is used herein to designate the direction opposite to the charged particle flow. Conversely, the term "downstream" is used herein to designate the direction along with the charged particle flow. In the current example, the terms "upstream" and "downstream" correspond to the negative axial direction −Z and the positive axial direction Z respectively. A center of gravity (i.e. mean position) of the beam current density distribution perpendicular to the axial direction Z defines the so-called "optical axis" A. The "radial direction" R corresponds to any direction in the transversal plane that points radially away from the optical axis A. The "angular direction" points along the (infinitesimal) angle of rotation of the radial position in the transversal plan According to an embodiment, the electrode body of the first electrode and/or the second electrode has a disk shape or an oblate ring shape.

According to an embodiment, at least one of the first and second electrodes comprises three support portions along a radially outward perimeter of the electrode body, and the three support portions jointly support a weight of the electrode body.

According to an embodiment, the support potions are sufficiently rigid to prevent deflection of the support portions with respect to the electrode body along the axial direction.

According to an embodiment, the electrode support portions of adjacent electrodes and interposed spacing structures are axially aligned to define a support column parallel with the axial direction.

According to a further embodiment, each support column is connected with a respective clamping member, for holding the support portions and interposed spacing structures together.

The clamping members for the respective support columns provide an efficient releasable attachment mechanism for assembling and disassembling the stack of collimator electrodes and spacing structures, allowing each part to be quickly replaced and/or repositioned if needed.

According to an embodiment, a support portion is connected in a radially movable manner to the electrode body of the corresponding electrode by means of an electrode support member.

According to a further embodiment, the electrode support member is provided along the outward electrode perimeter, thereby defining a thermal expansion space between the electrode support portion and the outer electrode perimeter.

According to an embodiment, the electrode support member comprises a movable elongated arm that is connected at a first end to the outer electrode perimeter and connected with a second end to a corresponding electrode support portion.

According to a further embodiment, the movable elongated arm comprises a flexible arm narrowing that allows deflection of the corresponding electrode support portion with respect to the electrode body in a radial-angular plane, while preventing deflection of the corresponding electrode support portion with respect to the electrode body in the axial direction.

According to yet a further embodiment, the flexible arm narrowing is included on at least one end portion of the movable elongated arm.

According to an embodiment, the movable elongated arm extends substantially along the angular direction, and the thermal expansion space forms a slot that extends substantially along the angular direction.

According to an embodiment, the support portions and the spacing structures of a corresponding support column comprise axially aligned through holes. The through holes jointly define a void that accommodates a corresponding clamping member, and the clamping member is pre-tensioned to exert a compression force on the support column parallel with the axial direction.

Accommodation of the column clamping member inside aligned through holes in the support portions and spacing structures yields a robust clamping mechanism that efficiently keeps the support portions and spacing structures axially aligned and ensures that the width of the column in the radial-angular plane remains relatively small (which may improve pumping efficiency during removal of molecules from the void defined inside the collimator stack).

According to a further embodiment, an inner diameter of a through hole in a support portion and/or a spacing structure is substantially larger than an outer diameter of the clamping member.

According to yet a further embodiment, a difference in the inner diameter of the through hole and the outer diameter of the clamping member leaves open a radial void for providing electrical insulation between the clamping member on the one hand and the support portion and/or spacing structure on the other hand.

According to an embodiment, a thickness of the electrode body of the first electrode and/or the second electrode is in the order of magnitude of an inter-electrode distance between the first electrode and the second electrode, as viewed along the axial direction.

According to a second aspect, and in accordance with the effects and advantages described herein above, there is provided a charged particle beam generator, comprising: —a beam source for generating a charged particle beam along an optical axis; —and an electrode stack with stack support system according to the first aspect. The first electrode is provided at an upstream end of the electrode stack and the beam source is provided upstream of the first electrode. The beam source and the electrode apertures of the electrodes are coaxially aligned along the optical axis.

According to an embodiment, the charged particle beam generator is adapted for operation as a particle beam collimator. In particular, the charged particle beam generator may be configured for applying an electric potential difference between a first electrode and a second electrode, and a further electric potential difference between the second electrode and a third electrode. The further electric potential difference is larger than the electric potential difference.

According to a further embodiment, at least the third electrode is provided with a cooling conduit for conducting a cooling liquid.

According to an embodiment, the charged particle beam generator comprises a generator vacuum chamber for accommodating the electrode stack. The generator vacuum chamber comprises chamber apertures adapted for passing through protruding support portions of the stack support system, and to allow the protruding support portions to establish a separate support connection outside of the generator vacuum chamber and with respect to the external reference frame. The charged particle beam generator comprises gaskets, wherein each gasket is adapted to seal a void between a respective chamber aperture and a corresponding protruding support portion.

According to an embodiment, the charged particle beam generator is formed as a beam generator module. The beam generator vacuum chamber is insertable into, supportable by, and removable from a carrier frame provided inside a vacuum chamber of a charged particle lithography system.

According to an embodiment, the charged particle beam generator comprises: —a source chamber located on an upstream end of the electrode stack, and adapted for accommodating the beam source on an inside thereof, —and source chamber support members for directly supporting the source chamber onto the stack support system.

The source chamber support members allow the source chamber to be supported on the external reference frame via the stack support structure, while avoiding direct mechanical coupling between the source chamber and the electrode stack. This support configuration may advantageously reduce effects of pressure-induced deformations in the source chamber on the alignment of the collimator stack. Conversely, the support configuration may advantageously reduce effects of thermally induced deformations of the electrode stack on the geometry of the source chamber.

According to a third aspect, and in accordance with the effects and advantages described herein above, there is provided a charged particle lithography system for processing a target. The system comprises: —a vacuum chamber enclosing a carrier frame; —and a charged particle beam generator according to the second aspect of the invention. The beam generator is accommodated by the carrier frame. The electrode stack comprises three stack support members. Each support member is connected to a middle region of the electrode stack at a first end, and to the carrier frame at a second end, so as to support the electrode stack on the carrier frame.

According to a fourth aspect, and in accordance with the effects and advantages described herein above, there is provided an electrode, adapted for use in a charged particle beam generator. The electrode comprises a ring-shaped electrode body provided with a top surface, and a bottom surface. The bottom surface and top surface are connected to each other via a side surface, and define an outer electrode perimeter. The electrode comprises three support portions along the electrode perimeter. Each support portion is configured to accommodate a least one spacing structure.

According to an embodiment, the electrode comprises three radially movable electrode support arms along the outer electrode perimeter. Each electrode support arm interconnects the outer electrode perimeter with a corresponding electrode support portion, thereby defining a thermal expansion space between the electrode support portion and the outer electrode perimeter.

According to a further embodiment, the electrode support arm comprises a radially elongated body that is connected at one end to the outer electrode perimeter and connected with an opposite end to the electrode support portion. The elongated body extends substantially along in the angular direction, and the thermal expansion space forms a slot that also extends substantially along the angular direction.

According to an embodiment, the electrode comprises a monolithic electrode body. The electrode body is preferably made of cast metal. More preferably, the cast metal of the electrode body essentially consists of aluminum.

Aluminum is a lightweight material (which facilitates construction and serviceability of the collimator stack), has good electrical conductance and non-magnetic properties (which is favorable in charged particle beam manipulation applications), and has good thermal conductance (which helps in dissipating thermal energy caused by charged particle scattering and collisions).

BRIEF DESCRIPTION OF THE DRAWINGS

Embodiments will now be described, by way of example only, with reference to the accompanying schematic drawings, in which corresponding reference symbols indicate corresponding parts, and in which.

The figures are meant for illustrative purposes only, and do not serve as restriction of the scope or the protection as laid down by the claims.

DESCRIPTION OF ILLUSTRATIVE EMBODIMENTS

Figure 1:
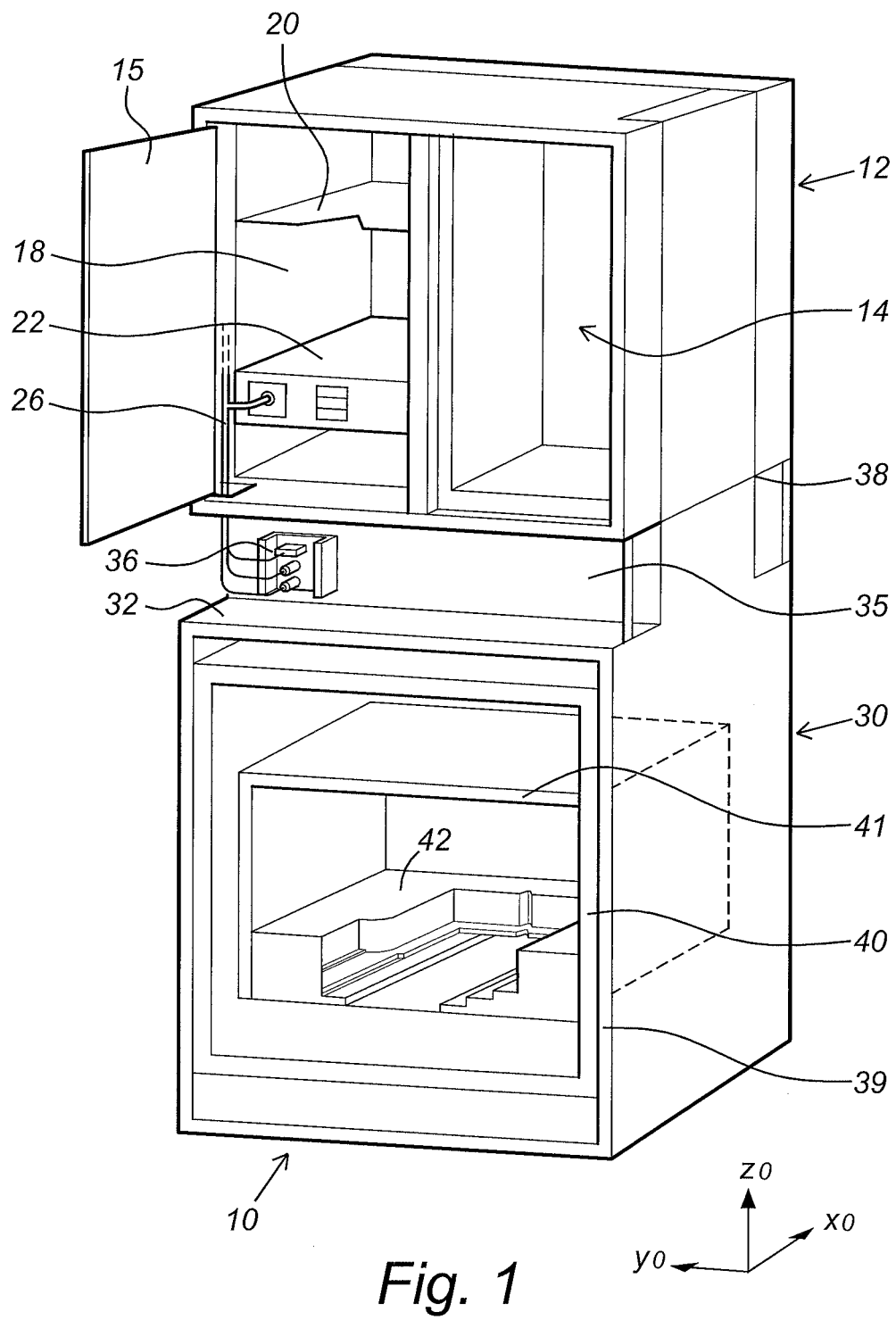
FIG. 1 schematically shows a perspective view of a charged particle lithography system according to an embodiment.

The following is a description of certain embodiments of the invention, given by way of example only and with reference to the drawings.
Lithography System FIG. 1 schematically shows a perspective view of a target processing machine, such as a lithography system 10. Such a lithography system 10 is adapted for lithographic processing of a semiconductor target 31 (e.g. the creation of structures onto a resist-covered semiconductor substrate). The lithography system 10 comprises (at a lower side) a vacuum chamber 30 for accommodating a projection column 46, and (at an upper side i.e. positioned above the vacuum chamber 30) a cabinet 12 for accommodating electronic equipment 22.

The cabinet 12 comprises a closable casing, defined by wall panels and provided on a front side with an opening 14 for accessing the interior of the cabinet 12. Two doors 15 are provided for covering the opening 14. The walls and doors define a cuboid shape that can be closed in a sealing manner to prevent air from entering the cabinet 12. The cabinet 12 encloses laterally spaced racks 18 carrying shelves 20 for housing the electronic equipment 22. On the top side 32, the vacuum chamber 30 is provided with a recessed section that comprises an interface wall 35 with access ports 36 for letting through conduits/cables 26 emanating from the beam projection column 46 inside the vacuum chamber 30 to electronic equipment 22 inside of the cabinet 12.

The vacuum chamber 30 is arranged for accommodating the target 31 and the projection column 46. The vacuum chamber 30 comprises a vacuum casing 39 (outer layer) that is configured to retain a vacuum environment on its inside (typically $10^{-3}$ bar or lower). Inside the vacuum casing 39, there is provided a support casing 40 (intermediate layer), and a carrier casing 41 with a carrier frame 42 (innermost region). The projection column 46 is supported by the carrier frame 42 on an inside of the carrier casing 41. The projection column 46 is configured for generating and manipulating multiple processing beamlets 47 that are used for processing the target 31. The projection column 46 may comprise various optical elements. Exemplary elements may be: an aperture array for forming a plurality of beamlets from the charged particle beam, a beamlet modulator for patterning the beamlets to form modulated beamlets, and a beamlet projector for projecting the modulated beamlets onto a surface of the target 31.

Figure 2:
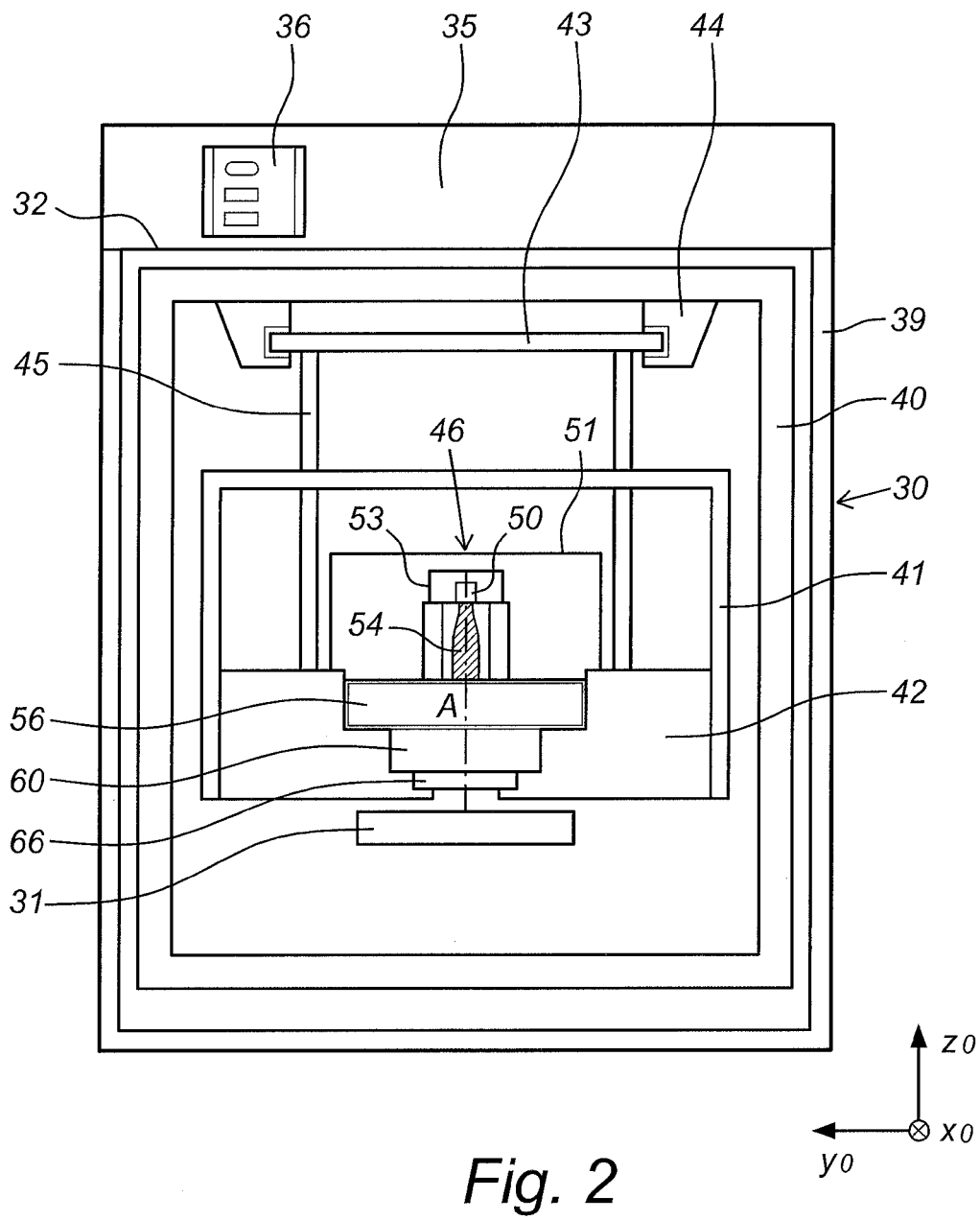
FIG. 2 presents a frontal view of a vacuum chamber of a charged particle lithography system according to an embodiment.

FIG. 2 shows a simplified schematic drawing of an embodiment of a charged particle lithography system 10. Such lithography systems are described for example in U.S. Pat. Nos. 6,897,458; 6,958,804; 7,019,908; 7,084,414; 7,129,502; 8,089,056 and 8,254,484; U.S. patent application publication no. 2007/0064213; 2009/0261267; US 2011/0073782; US 2011/0079739 and US 2012/0091358, which are all assigned to the owner of the present invention and are all hereby incorporated by reference in their entirety.

FIG. 2 presents a frontal view a vacuum chamber 30 of a target processing system 10. The projection column 46 with a charged particle beam generator 50 is accommodated by the carrier frame 42 on the inside of the vacuum chamber 30. The charged particle beam generator 50 is formed as a beam generator module that is insertable into and removable from the carrier frame 42 inside the vacuum chamber 30 of the charged particle lithography system 10. The carrier casing 41 and carrier frame 42 are moveably suspended within the support casing 40 by means of suspension members 44 (e.g. leaf springs) that are connected to a suspension base 43, which in turn is moveably interconnected with the carrier casing 41 by means of a plurality of rigid but laterally hingeable suspension rods 45.

A charged particle beam 54 is generated by the charged particle beam generator 50, and subsequently manipulated by the various optical elements provided in the projection column 46.

Figure 3:
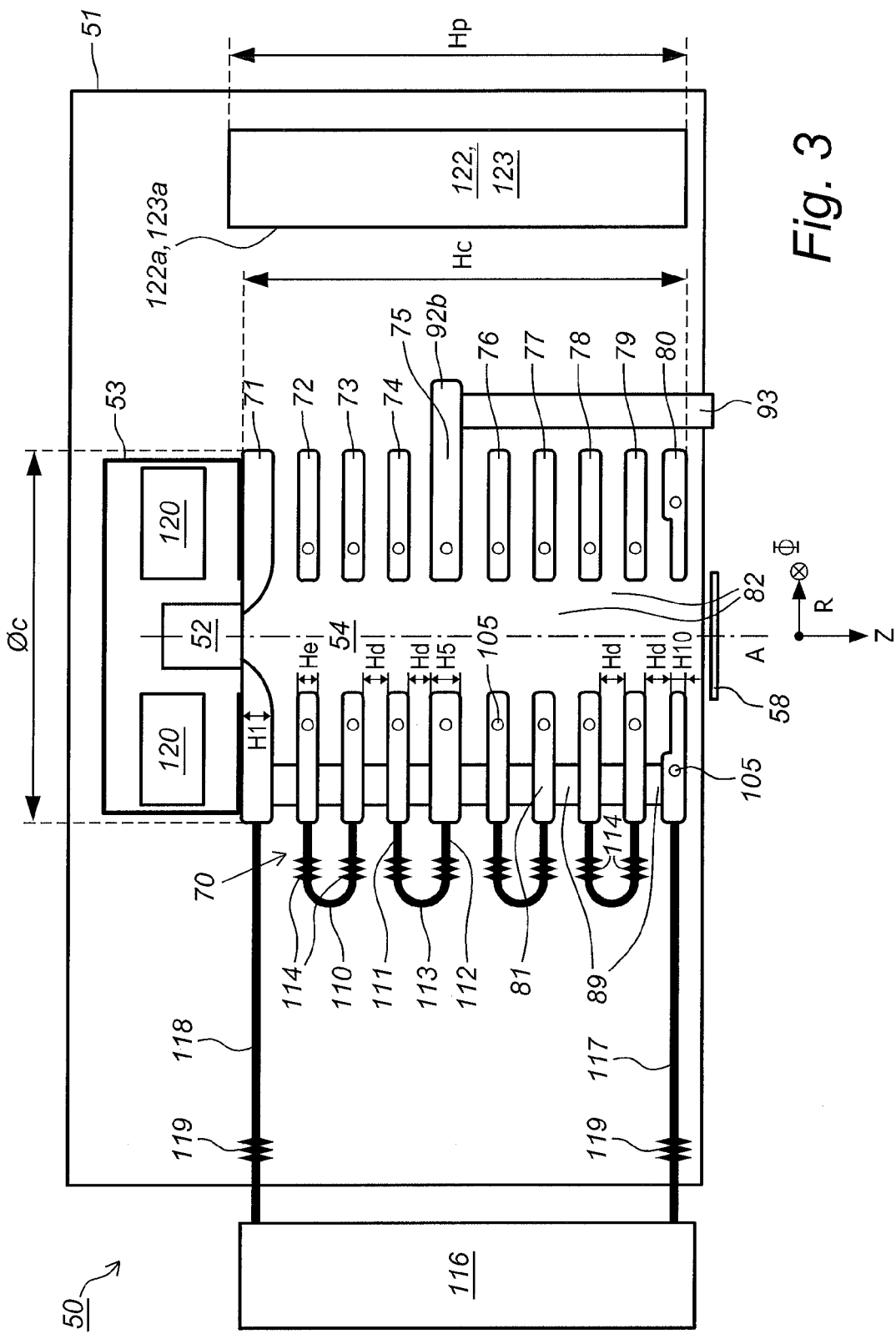
FIG. 3 shows a schematic side view of a beam generator according to an embodiment.

The term "refracting" is used herein to generally indicate the action of deflecting portions of a beam. The term "collimating" is used herein to indicate the action of making various portions of a beam more parallel.
First Beam Generator Embodiment FIG. 3 shows a schematic cross-sectional view of a beam generator module 50 according to an embodiment. The cross sectional view is defined in an axial-radial plane i.e. which is spanned by the axial direction Z and the radial direction R.

Shown in FIG. 3 is a beam generator chamber 51, which encloses elements, components and/or modules that make up the beam generator 50. The beam generator 50 comprises a charged particle beam source 52, a collimator stack 70, and vacuum pumps 122, 123 for creating a vacuum inside the beam generator chamber 51 (only vacuum pump 122 is shown).

The beam source 52 is accommodated within a beam source vacuum chamber 53, which in turn is located within the beam generator chamber 51. The beam source 52 is fixed to a top side of the collimator stack 70, and configured to generate a charged particle beam 54 along optical axis A. The beam source chamber 53 encloses source vacuum pump units 120, which allow an ultra-low vacuum to be created locally near the beam source 52, to improve its radiation emission efficiency and prolong its effective radiation lifetime.

The charged particle beam 54 generated by the charged particle source 52 may initially have radially outward diverging properties while travelling along the optical axis A. The collimator electrode stack 70 may then serve to refract portions of the charged particle beam 54 selectively, thereby collimating the beam i.e. making the various parts of the beam distribution travel downstream with greater co-linearity along the optical axis A.

Collimator stack 70 comprises an axially arranged stack (i.e. sequence) of collimator electrodes 71-80 that are mutually displaced along the axial direction Z by means of spacing structures 89, which are made of an electrically insulating material. The collimator electrodes 71-80 are formed by flat ring-shaped bodies 81, each of which comprises an electrode aperture 82. In the shown embodiment, the ring-shaped bodies 81 are displaced at equal distances Hd along the optical axis A, and the electrode apertures 82 are coaxially aligned along the optical axis A. The electrode bodies 81 are preferably made of an electrically conducting and mechanically rigid material. Sufficient electrical conductivity enables easy application of a homogeneously distributed electrical charge onto each respective surface of the collimator electrodes 71-80. Sufficient mechanical rigidity allows the collimator electrodes 71-80 to retain a fixed spatial configuration and hence to sustain steady electric potential differences during generation of the particle beam 54. Preferably, the electrodes 71-80 are made from aluminum. Aluminum is a light-weight material with good electrical conductance and non-magnetic properties, and which furthermore provides sufficient thermal conductance for dissipating thermal energy that is accumulated during charged particle beam generation.

The formation of a plurality of collimator electrodes 71-80 and spacing structures 89 into a coaxially aligned electrode stack 70 provides the possibility to optimize the electric field distribution within the collimator stack 70 at different positions along the optical axis A. The use of a plurality of separated collimator electrodes 71-80 allows for a relatively lightweight design.

Thicknesses H1, H5, He of the collimator electrodes 71-80 along the vertical direction Z may be sufficient for accommodating a liquid conduit 105 on an inside of respective electrode bodies 81, while ensuring sufficient structural integrity of the electrode body 81 during beam generation, even under considerable thermal stresses.

An uppermost collimator electrode 71 in the collimator stack 70 (i.e. the collimator electrode 71 that is encountered and traversed first by the charged particle beam 54 upstream of the stack 70) comprises a diverging curved aperture. A last collimator electrode 80 in the collimator stack 70 (i.e. the collimator electrode that is encountered last by the charged particle beam 54 downstream along the optical axis A) has a relatively small inner thickness H10. Electrode properties of the stack are further discussed with reference to FIG. 6.

The collimator electrodes 71-80 are spaced with respect to each other by means of the electrically insulating spacing structures 89. The spacing structures 89 define a minimal distance Hd between the electrodes 71-80, which prevents the occurrence of electrical discharge between adjacent electrodes, even at relatively large electrical potential differences that are to be applied between the electrodes during beam generation (potential differences in the order of kilovolts per millimeter).

The spacing structures 89 are made of an electrically insulating material that also has a high resistance to mechanical compression, to keep the distances between the electrodes fixed, and to avoid the electrodes from becoming electrically connected (i.e. becoming electrical equipotential surfaces). The spacing structures 89 may for example be made of a ceramic. Preferably, each spacing structure 89 is provided between a pair of adjacent collimator electrodes. Three such spacing structures 89 are provided between each pair of adjacent collimator electrodes, to provide two stable 3-point support planes, one for each adjacent collimator electrode, while maintaining a well-defined inter-electrode spacing Hd.

The collimator stack 70 is suspended within the beam generator chamber 51 by means of support protrusions 92b and support legs 93 that surround the stack 70 on three sides. The support legs 93 are used to fix the collimator stack 70 with respect to an external reference frame (e.g. carrier frame 42).

Figure 4:
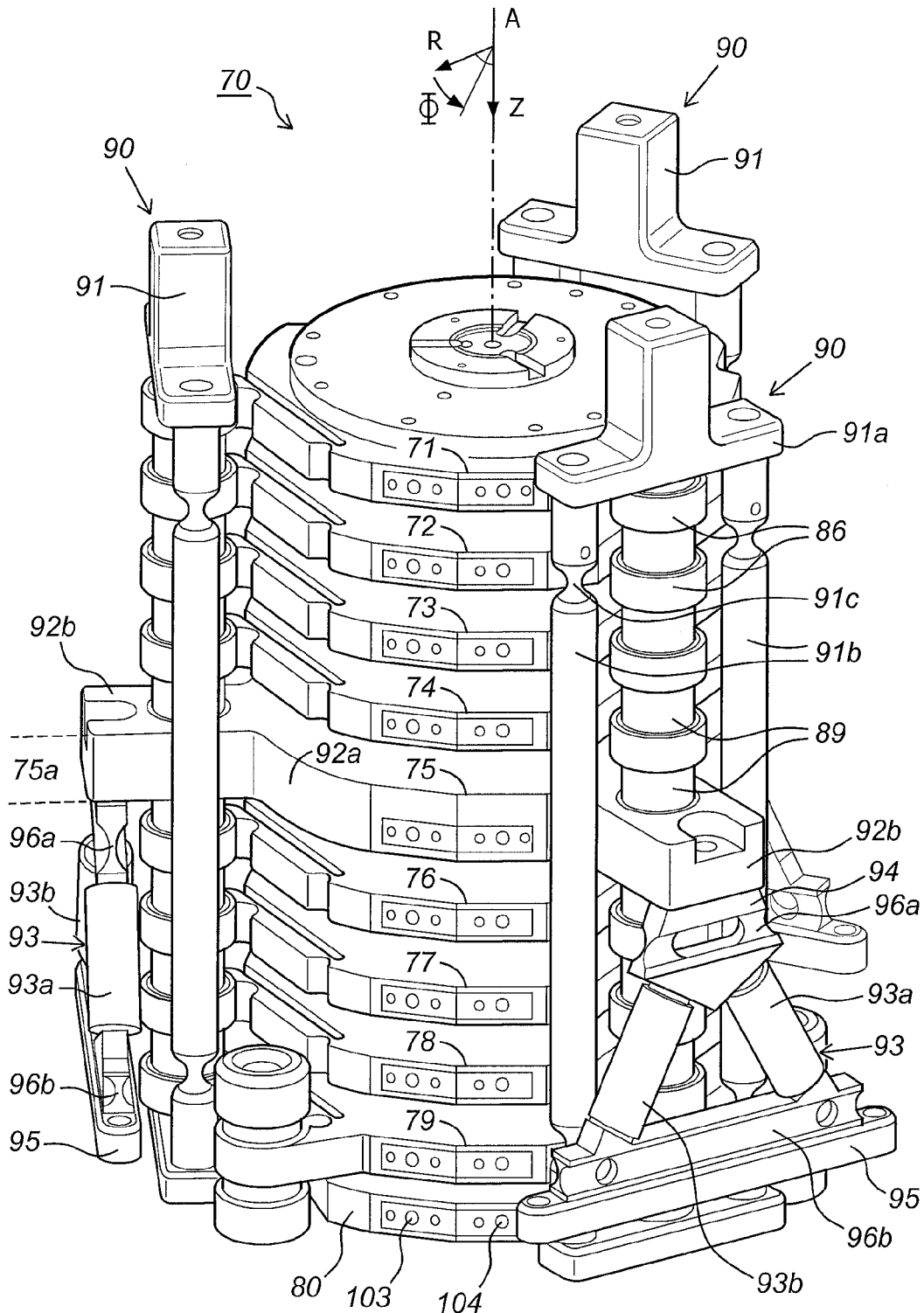
FIG. 4 shows a perspective view of a collimator electrode stack according to an embodiment.

Embodiments of the cooling arrangement (e.g. comprising elements 110-114 and 116-119) are described herein below, in conjunction with FIGS. 7a-7d, First Collimator Electrode Stack Embodiment FIG. 4 shows a perspective view of a collimator electrode stack 70 according to an embodiment. This embodiment comprises ten collimator electrodes 71-80 for shaping the electron beam 54 propagating along the optical axis A in the axial direction Z.

The first collimator electrode 71 comprises source engagement members for fixing the charged particle beam source 52 to the first collimator electrode 71 on a top side thereof, and source alignment members for aligning the optical axis A of the generated charged particle beam 54 with a centerline of the collimator apertures.

Each of selected collimator electrodes 71-74, 76-80 comprises three support portions 86 along an outer electrode perimeter. Each support portion 86 accommodates a spacing structure 89 on one side, and possibly another spacing structure 89 on the opposite side. In this embodiment, the spacing structures 89 are formed by cylindrical objects with flat end surfaces that support or are supported by the electrode support portions 86. Cylindrical spacing structures 89 with uniform diameters are easy to manufacture in large numbers, which facilitates construction and maintenance of the collimator stack 70. In addition, the rounded shape of the cylindrical spacing structures 89 helps to reduce perturbing effects of the spacing structures on the electric field inside the electrode collimator stack 70. Construction of the collimator stack 70 is further facilitated and standardized by manufacturing spacing structures 89 with a uniform predetermined spacer height Hs. This allows all collimator electrodes 71-80 to be efficiently aligned and spaced over equal predetermined mutual distances Hd along the axial direction Z.

In the shown embodiment, three of such electrically insulating cylindrical spacing structures 89 are arranged between each adjacent pair of electrodes. Three spacing structures 89 form a radially and angularly equally spaced tripod i.e. each spacing structure 89 is located at an equal radial distance from the optical axis A, and the three spacing structures 89 are mutually spaced at 180° angles about the optical axis A. The resulting three-point support allows the collimator electrodes to be carried along their respective transversal planes in a stable manner, and allows electrode alignment with a high accuracy (typically with a maximum alignment error below 10 micrometers). The equal radial and/or angular spacing is not essential, but yields a preferred robust arrangement that facilitates accurate collimator alignment.

The electrode support portions 86 of adjacent collimator electrodes and interposed spacing structures 89 are axially aligned to define support columns 90 directed parallel with the axial direction Z. Three support columns 90 are defined in this embodiment.

The support columns 90 are each provided with clamping members 91a, 91b, for holding the support portions 86 and interposed spacing structures 89 together. Ledgers 91a are provided at axial extremities of the support columns 90. The ledgers 91a are pulled together along the axial direction Z by means of two pre-tensioned rods 91b that connect the ledgers 91a at the rod ends. The clamping members 91a, 91b are made of a rigid material that has sufficient tensile strength to provide a robust clamping mechanism with which the collimator electrodes 71-80 and spacing structures 89 can be axially compressed into mutually fixed positions. Each pre-tensioned rod 91b may be provided with a narrowing 91c, to accommodate differential thermal expansion between the collimator stack 70 and the respective pre-tensioned rod 91b. The clamping members 91a, 91b are preferably made of a non-magnetic material, to avoid generation of perturbing field responses to the magnetic fields generated by the charged particle beam 54. In view of the above, the clamping members 91a, 91b are preferably made of titanium.

The collimator electrode stack 70 comprises three stack support legs 93. Each support leg is connected to a middle region 75a of the collimator stack 70. The support legs 93 cooperate to support the collimator stack 70 with respect to an external reference frame. The external reference frame may for example be the carrier frame 42 suspended inside the vacuum chamber 30 of the charged particle lithography system 10 shown in FIG. 1.

During beam generation, mechanical resonances may be induced within the collimator stack 70 from external sources (e.g. from floor vibrations that reach the collimator stack 70 via the carrier frame 42, and from flow fluctuations occurring in cooling liquid that is pumped through cooling conduits 105 in the collimator electrodes 71-80). By supporting the collimator stack 70 via connection of the support legs 93 to the middle region 75a, the lengths and weights of stack portions that participate in induced mechanical resonances are reduced.

The induced mechanical resonances may relate either to linear motion, to rotational motion, or to both. By reducing the effective stack lengths, the effective linear spring constant for deflections perpendicular to the axial direction Z is increased, as shorter columns 90 make stiffer columns. Stiffer columns reduce transversal deflection response of the electrodes 71-80 in the stack. With stiffer columns 90, the electrodes 71-80 will vibrate less with respect to each other, and hence vibrate less with respect to the environment, which will ultimately improve the beam projection accuracy.

Furthermore, by engaging the stack approximately halfway at the vertical center of mass of the stack, the moments of inertia for the stack as a whole and about rotation axes in the transversal plane are reduced, which also reduces rotational deflection response of the stack as a whole to externally driven lower frequency torque oscillations.

In the embodiment shown in FIG. 4, the middle region 75a of the collimator stack 70 (i.e. the vertical center of mass) is selected to correspond to the middle collimator electrode 75 of the collimator stack 70. Here, the middle electrode 75 is formed by the fifth collimator electrode 75 counted downstream from the source 52 (not shown in FIG. 4 but in FIG. 3. The preference here for the fifth electrode as the middle electrode (in contrast to e.g. the sixth electrode 76) relates to the additional weights of the thicker first electrode 71 and the source 52 to the stack 70.

The middle collimator electrode 75 comprises an electrode body 92a that is provided with three stack support protrusions 92b along the outer electrode perimeter. Radially extending stack support protrusions 92b along the outer perimeter of the middle electrode 75 provide a robust support construction that may be easily manufactured e.g. via uni-body casting of the middle electrode 75. The electrode body 92a and protrusions 92b have sufficient mechanical strength for jointly supporting a total weight W of the collimator electrode stack 70. Each stack support leg 93 is connected to a respective stack support protrusion 92b.

In alternative embodiments (not shown), the support legs 93 may engage with the spacing structures 89 in the support columns 90 (alternative or in addition to engaging the middle collimator electrode 75) to establish a balanced supporting connection with the external reference frame.

In the embodiment of FIG. 4, each stack support leg 93 comprises a leg joint 94 for connecting the support leg to the middle stack region 75a (e.g. to support protrusion 92b). Furthermore, each stack support leg 93 comprises a leg base 95 for connecting the support leg 93 to the external reference frame. Near the leg base 95, the stack support leg 93 has a triangular support structure with separate leg members 93a-93b directed at least partially along opposite angular directions. The leg members 93a-93b may be made of mechanically rigid but electrically insulating material. Above and below these leg members 93a-93b, each support leg 93 comprises two radial deflection portions 96a-96b for allowing the leg joint 94 to displace in the radial direction R with respect to the leg base 95. In the embodiment of FIG. 4, the radial deflection portions 96a-96b comprise beams with a cross-section having a curved I-profile defining a flexible narrow middle region. Each beam is substantially oriented perpendicular to the (local) radial direction, thereby allowing the I-profile to flex only within the local radial-axial plane, while remaining mechanically stiff in the local angular direction. The allowed radial displacements between the leg joints 94 and corresponding leg bases 95 may for example result from radially directed thermal deformation of the middle stack region 75a (e.g. middle electrode 75) with respect to the leg bases 95 during beam generation. The middle collimator electrode 75 is envisioned to be held at a relatively high positive electrical potential during beam generation, which will result in a large number of secondary/backscattered electrons impacting on this middle electrode 75. The resulting heating will cause radial expansion of the collimator electrode 75, while the external reference frame will not experience such thermal deformation. The differential radial deformation can be efficiently accommodated by the radial deflection portions 96a, 96b, and radial tilting of the leg members 93a-93b between these deflection portions 96a, 96b.

In alternative embodiments (not shown), the support system may also be differently shaped. For example, additional leg segments may be included above and/or below the triangular structures with leg members 93a-93b, in order to form e.g. A-shaped support legs. Furthermore, the radial deflection portions 96a-96b may be formed differently, e.g. having a different cross-sectional profile.

According to various embodiments, the external reference frame (e.g. carrier frame 42) may support the electrode stack 70 in the middle region 75a via support members 93 that may be oriented in any of a downward axial direction Z (compression stresses exerted on support legs 93; shown in FIG. 4), an upward axial direction −Z (tensile stresses exerted on support members 93; not shown), a radial direction R (bending stresses on support members 93; not shown), or combinations thereof.

Collimator Electrode

Figure 5:
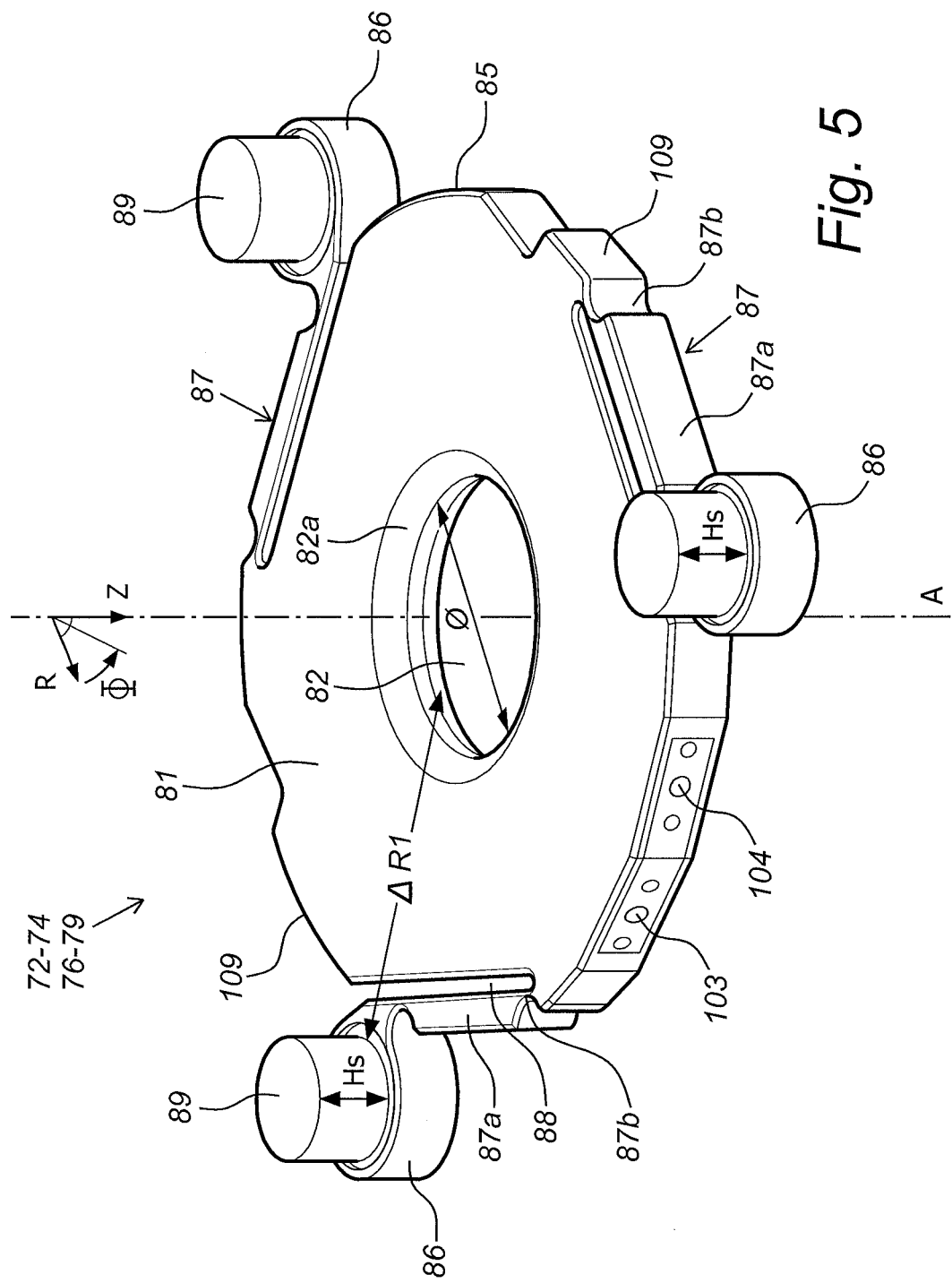
FIG. 5 shows a perspective view of a collimator electrode according to an embodiment.

FIG. 5 shows a perspective view of an embodiment of an intermediate collimator electrode 72-74, 76-79. The intermediate collimator electrode 72-74, 76-79 is formed by a flat electrode body 81 made of electrically conducting and mechanically rigid material, with a collimator aperture 82 provided at a center of the flat body 81. The collimator aperture 82 is substantially circular as viewed along the axial direction Z, and defines an inner aperture diameter Ø. Furthermore, the circular aperture 82 has a rounded (i.e. a curvedly trimmed) aperture perimeter 82a, viewed in a cross-section along the angular direction Φ (i.e. a cross-section in an axial-radial plane). The rounded aperture perimeter 82a helps to avoid high local electric field concentrations along the aperture perimeter 82a. The rounded aperture perimeters 82a may be shaped to avoid generation of local electric field strengths above 5 kilovolts per millimeter.

The collimator electrode 71-80 comprises three support portions 86 along an outer electrode perimeter 85. Each support portion 86 is configured to accommodate one spacing structure 89 on one side (e.g. for the first and last electrodes 71, 80) or spacing structures 89 on each side (e.g. for the intermediate electrodes 72, 73, 74, 76, 77, 78, 79).

The spacing structures 89 between the collimator electrodes 71-80 preferably have equal heights Hs along the axial direction Z. Spacing structures 89 with an equal height facilitates manufacturing standardization for the spacers 89, as well as for other structures that are to be attached between collimator electrodes (e.g. intermediate cooling conduits, discussed below). Preferably, a spacer height Hs is smaller than one third of a shortest radial distance ΔR1 from the collimator aperture perimeter 82a to a lateral surface of a nearby spacer 89. Electric field perturbations at the collimator aperture 82 due to the presence of the spacer structures 89 are thereby reduced to negligible levels.

The collimator electrode 71-80 is provided with three electrode support arms 87 along an outer electrode perimeter 85 of the electrode plate body 81. The three electrode support arms 87 are preferably distributed equally spaced around the outer electrode perimeter 85 (at equal distances along the angular coordinate). The electrode support arms 87 slightly protrude radially along the outer perimeter 85, and extend substantially along the angular direction Φ. Each electrode support arm 87 may comprise at least one rigid arm portion 87a that is connected on one distal end via a flexible arm narrowing 87b to the outer perimeter 85 of the electrode body 81. Each electrode support arm 87 may be connected on its opposite distal end to a corresponding electrode support portion 86. Each electrode support portion 86 may be formed by a circular platform. A second flexible arm narrowing 87c may be provided between the rigid arm portion 87a and the electrode support portion 86. The rigid arm portion 87a and the flexible arm narrowings 87b-87c preferably have a height along the axial direction that is identical or at least comparable to a height of the corresponding collimator electrode, so as to provide sufficient mechanical stiffness/strength for supporting the collimator electrode in the axial direction Z. The narrowing provided in each of the flexible arm narrowings 87b-87c is predominantly defined in a direction in the radial-angular plane, and more preferably directed along the (local) radial direction R. In this embodiment, the flexible arm narrowings 87b-87c effectively form leaf springs that mainly allow deformation and flexing of the corresponding electrode support portion 86 with respect to the electrode body 81 in the radial-angular plane, while preventing flexing of the corresponding electrode support portion 86 with respect to the electrode body 81 in the axial direction Z. Each electrode support arm 87 defines a thermal expansion slot 88 between the electrode support body 81 and the electrode support arm 87. The thermal expansion slot 88 also extends in the radial-angular plane and substantially along the angular direction Φ.

The radially movable arm 87 with its one or more flexible arm narrowings 87b-87c as well as the thermal expansion space 88 enable the electrode body 81 to deform (expand/contract) predominantly in the radial-angular plane, and more particularly in the radial direction R, while keeping the support portions 86 axially aligned with corresponding support portions 86 of adjacent collimator electrodes. It is expected that during use of the collimator electrode stack 70, the collimator electrodes 71-80 will be held at different electric potential values, and receive different amounts of (secondary/backscatter) electron radiation and of resulting thermal energy. The movable arms 87 and expansion spaces 88 efficiently accommodate for the varying and different thermally induced radial deformations of the electrodes 71-80 occurring during generation and collimation of the charged particle beam 54, whereby the support columns 90 (see FIG. 4) remain mutually aligned along the axial direction Z.

The middle collimator electrode 75 and adjacent intermediate collimator electrodes in the embodiment shown in FIG. 4 are designed to be subjected to large positive electric potentials during beam generation. Also, the last electrode 80 in the stack 70 is designed to be subjected to a considerable electric potential (in the order of +0.5 to +1.5 kilovolts). The resulting considerable attractive forces that any of these electrodes will exert on secondary electrons and backscattered electrons will give rise to a significant electron collision and absorption, and hence to a considerable heat generation. For example, radial expansion of the middle collimator electrode 75 will force the electrode support columns 90 to move radially outward, which will pull the support portions 86 of other collimator electrodes outwards. However, the radially movable support arms 87 provided on the remaining collimator electrodes will accommodate for this radial expansion, thereby keeping all electrodes 71-80 coaxially aligned.

Applying Electric Potentials

Figure 6:
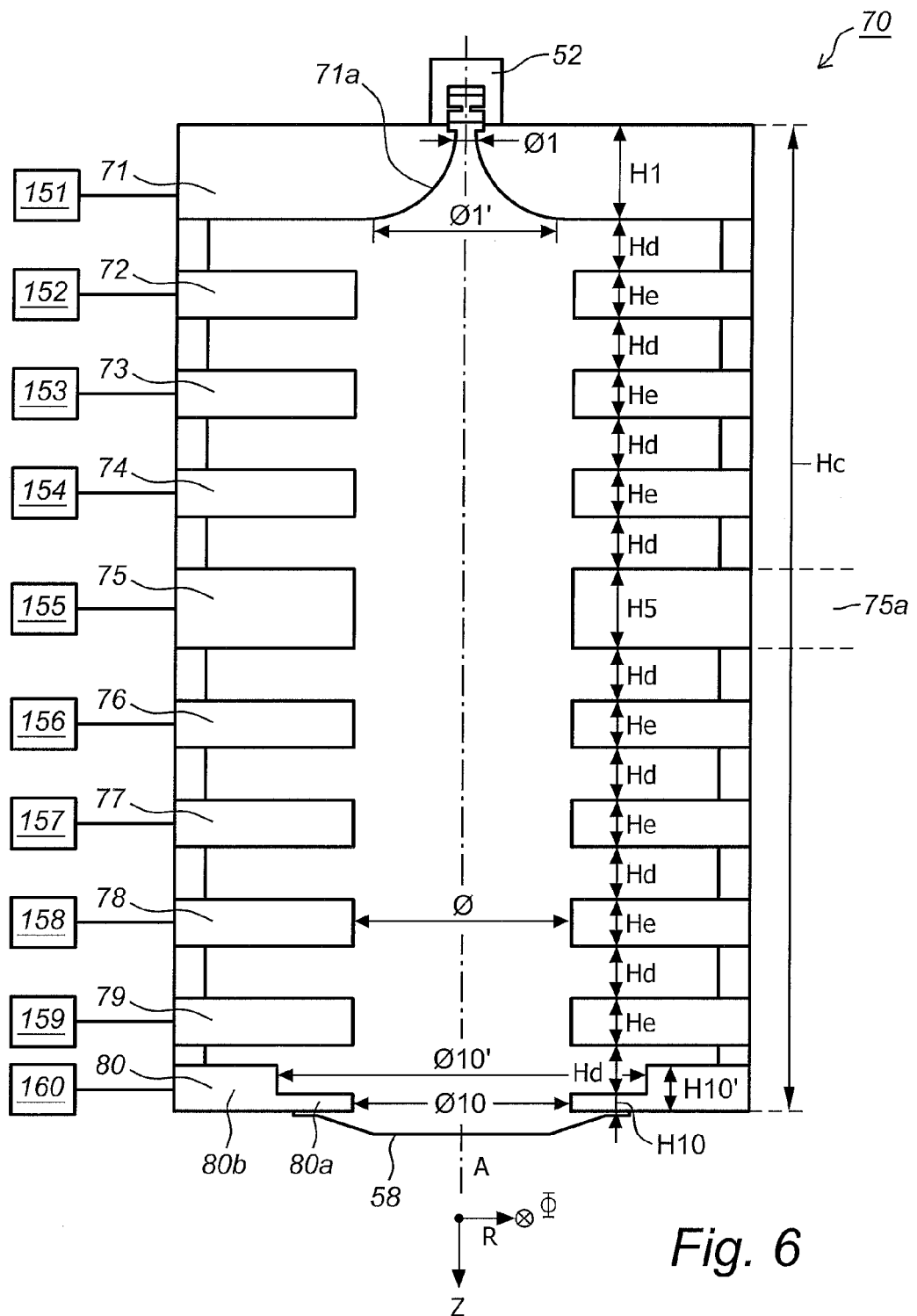
FIG. 6 shows a schematic cross-sectional side view of a collimator electrode stack according to an embodiment.

FIG. 6 shows a schematic cross-sectional side view of a collimator electrode stack 70 according to an embodiment. The collimator electrode stack 70 comprises ten collimator electrodes 71-80, wherein the fifth collimator electrode 75 constitutes the middle collimator electrode. The shown cross-section only schematically depicts several characteristic dimensions of this embodiment of the collimator electrode stack 70. Many construction details of this embodiment are omitted for simplicity (for example, detailed shapes of collimator apertures, electrode support portions, and spacing structures are not shown)

In general, the use of multiple collimator electrodes 71-80 separated by spacing structures 89 so as to form a coaxially arranged collimator electrode stack 70 provides the possibility for optimizing the electric field distribution in the collimator stack 70 at different positions along the optical axis A.

The step-wise variation of the electric potential differences between at least five adjacent collimator electrodes results in a relatively smoothly varying electric field distribution along the axial direction A. An electrode stack comprising five or more collimator electrodes allows generation of an electric field distribution that may have a plurality of negative electric field minima as well as a plurality of positive electric field maxima, and hence yields sufficient degrees of freedom for generating electric fields that may both collimate a charged particle beam 54 as well as reduce spherical aberrations in the charged particle beam 54. Finding preferred beam characteristics for a particular application is achieved easily with the multi-collimator electrode stack via variation of the applied electrical potential values.

The inventors noted that, in one particular embodiment, the use of ten collimator electrodes 71-80 in a collimator stack 70 provides a good balance between the degrees of freedom for creating a relatively gradual electrical potential distribution along the axial direction Z on one hand, and obtaining sufficient inter-electrode spacing Hd for providing a good line of sight with vacuum pumps 122, 123, sufficient electrode cooling, and constructional simplicity on the other hand.

In the embodiment of the collimator electrode stack 70 shown in FIG. 6, the intermediate electrode thicknesses He of all the intermediate collimator electrodes 72, 73, 74, 76, 77, 78, 79 are substantially identical. The term "substantially identical" herein refers to intermediate electrode thicknesses He that have the same value within achievable manufacturing tolerances. For collimator electrodes made from aluminum, the intermediate electrode thickness He may be in the range of 10 millimeters to 20 millimeters, preferably in the range of 12 millimeters to 15 millimeters, and more preferably equals 13.6 millimeters. Using intermediate electrodes of equal thickness allows mass production of the electrode bodies and simplifies the assembly of the intermediate collimator electrodes into a collimator stack. In alternative embodiments, all of the electrodes may have identical thicknesses. Yet in other embodiments, some or all of the electrode thicknesses may be different.

An uppermost collimator electrode 71 in the collimator stack 70 (i.e. the collimator electrode 71 that is encountered and traversed first by the charged particle beam 54 upstream of the stack 70 and along the optical axis A) comprises a smaller upper aperture diameter Ø1, followed by a divergently curved aperture bore 71a. The small upper aperture diameter Ø1 and curved aperture bore 71a allow a charged particle beam 54 generated by the beam source 52 to experience a gradual electric field change. A first electrode thickness H1 of the first collimator electrode 71 is in a range defined by $1.5 \cdot He \leq H1 \leq 2.5 \cdot He$. A first collimator electrode 71 having a thickness in the specified range allows the upstream end (i.e. the top) of the collimator stack 70 to have a smooth transition from a relatively small beam source aperture, to the relatively larger collimator apertures, and allows the first electrode to have sufficient strength for directly supporting a weight of the beam source 52 that is mountable thereon. The term "smooth" is used herein to indicate that a surface (here, the aperture surface) has no abrupt changes in curvature (i.e. sharp ridges, corners, or crevices) at a macroscopic scale. Abrupt curvature changes would generate undesirably large local variations in the electric field.

A middle collimator electrode 75 is provided between the first collimator electrode 71 and the last collimator electrode 80. The intermediate collimator electrodes 72, 73, 74, 76, 77, 78, 79 are located between the first collimator electrode 71 and the last collimator electrode 80, and on both sides of the middle collimator electrode 75. A middle electrode thickness H5 of the middle collimator electrode 75 is in a range defined by $1.5 \cdot He \leq H5 \leq 2.5 \cdot He$. Preferably, the middle electrode thickness H5 lies in a range between 22 millimeters to 26 millimeters, and more preferably equals 24 millimeters. A middle collimator electrode 75 having a thickness H5 in the specified range allows the center region 75a of the collimator stack 70 to have sufficient strength and bending stiffness for preventing the collimator electrode stack 70 from vibrating e.g. about transversal axes (perpendicular to the axial direction Z).

In alternative embodiments, the middle electrode 75 may have a thickness H5 that is substantially equal to the thickness He of the intermediate electrodes 72-74, 76-79. This may for example be achieved by the use of mechanically stronger materials, or in the case that the stack support structure engages other and/or more electrodes in the collimator stack. This is further explained with reference to FIG. 15.

The last collimator electrode 80 in the collimator stack 70 (i.e. the collimator electrode that is encountered last by the charged particle beam 54) has a radially inner portion 80a with a last electrode inner thickness H10. The inner thickness H10 lies in a range defined by $H10 < He/3$. The inner thickness H10 of the last electrode 80 preferably has a relatively small value to effectively sustain an electric potential with opposite polarity with respect to the charged particle beam 54 while extending over only a small axial distance. This produces a highly localized attractive E-field near the aperture perimeter. The thin last electrode 80 with opposite polarity produces negative spherical aberration for a beam of charged particles, to compensate for positive spherical aberrations in the beam that have been generated in the preceding part of the collimator stack 70.

The last collimator electrode 80 has a last electrode outer thickness H10' at a radially outer portion 80b. The last electrode outer thickness H10' preferably equals the intermediate electrode thickness He, to make the last electrode 80 mechanically stronger, and also to provide sufficient height for accommodating a cooling conduit inside the outward portion. As shown in FIG. 6, the transition from the inner portion 80a to the outward portion 80b may involve an axial stepwise increase from inner thickness H10 to outer thickness H10'. This creates an inner aperture diameter Ø10 for the radially inner portion 80a, and an outer aperture diameter Ø10' for the radially outer portion 80b. According to a preferred embodiment, the inner body thickness H10 of the last collimator electrode 80 is in a range of 5 millimeters or smaller, the outer body thickness H10' is in a range of 10 millimeters or larger, the inner aperture diameter Ø10 is 60 millimeters, and the outer aperture diameter Ø10' is 100 millimeters.

Downstream of the last electrode 80, there is provided an aperture array 58 for forming a plurality of beamlets from the charged particle beam 54. The aperture array 58 may be a structural component of the collimator electrode stack 70. Alternatively, the aperture array 58 may form part of a condenser lens module 56 that is arranged in the projection column 46 directly downstream from the beam generator module 50 (as viewed along the optical axis A). The aperture array 58 comprises a lower central surface and slanted lateral surfaces. During operation, the aperture array 58 is preferably kept at ground potential. The shape of the aperture array 58 creates sufficient distance between the inner perimeter of the (relatively) thin radially inner electrode portion 80a of the last collimator electrode 80, to avoid electrical discharging between the (sharp edges of the) charged last collimator electrode 80 and the aperture array 58. The shape of the aperture array 58 also ensures that the spacing between the aperture array 58 and the radially outward electrode portion 80b of the last collimator electrode 80 is kept small, to preserve the vacuum inside the collimator electrode stack 70 with respect to the region outside the beam generator module 50 and/or outside the condenser lens module 56.

FIG. 6 helps to illustrate exemplary methods for operating this embodiment of the collimator electrode stack 70 during beam generation and processing. In this embodiment, the collimator electrodes 71-80 are positioned at equal distances Hd along the optical axis A in a coaxial arrangement.

In other embodiments, the collimator electrodes may be positioned at different inter-electrode distances. See for example the embodiments discussed with reference to FIGS. 9-11.

Different electrostatic potential values (i.e. voltages) are applied to the collimator electrodes 71-80. The collimator electrode stack 70, the charged particle beam generator 50, or the charged particle lithography system 10 may comprise a set of distinct voltage sources 151-160. Each voltage source 151-160 comprises an output terminal for applying a selected electric potential to a respective collimator electrode 71-80. An electric connection is provided between the output terminal of each voltage source 151-160 and the electrical contact 109 of a corresponding collimator electrode 71-80. Preferably, the voltage sources 151-160 are independently and dynamically adjustable during operation of the beam generator 50. Alternatively, the voltage sources 151-160 may be formed as a single power supply with suitable adaptors and dividers to convert its output(s) to distinct selected voltage values to be applied to the corresponding collimator electrodes 71-80.

Below, is a table of two numerical simulations (one per column), which corresponds to a preferred arrangement for the collimator electrodes, and to two preferred electric potential distributions applied to the electrodes 71-80. The sequence of electrode numbers in the table corresponds to the sequence of collimator electrodes 71-80 as used in the description with reference to e.g. FIGS. 4 and 6.

| Electrode # | V-distribution 1 (along Z) | V-distribution 2 (along Z) |
| --- | --- | --- |
| 71 | 0 V | 0 V |
| 72 | −3165 V | −3649 V |
| 73 | 5577 V | 3907 V |
| 74 | 23160 V | 19140 V |
| 75 | 29590 V | 21990 V |
| 76 | 17400 V | 9651 V |
| 77 | 4870 V | 1525 V |
| 78 | 698 V | −313.5 V |
| 79 | 52 V | −491.9 V |
| 80 | 1023 V | 702.2 V |

The listed electric potential values for the various electrodes correspond to potential differences with respect to ground potential. Each of the electric potential values may be applied to the collimator electrodes 71-80 by the corresponding voltage source 151-160. During operation, the aperture array 58, which is located directly downstream of the last collimator electrode 80, is preferably kept at ground potential. A method for operating a charged particle beam generator 50 may comprise: —generating an electron beam 54 with the beam source 52; —projecting the generated electron beam along an optical axis A through the apertures 82 of the collimator electrode stack 70; —applying electrical potentials onto the collimator electrodes 71-80, comprising: —keeping a first collimator electrode 71 at ground potential; —keeping a middle collimator electrode 75 at a highest positive electric potential, and —keeping a last collimator electrode 80 at a low positive electric potential.

The electric potential differences applied across the collimator electrodes serve to produce a homogeneous transversal electron beam surface current density, while reducing the angular error. During beam generation, the electron beam 54 emanates from the beam source 52 with a locally diverging contour as viewed in a cross section in a radial-axial plane.

The strongly increasing electric potential values applied to the third, fourth, and fifth collimator electrodes 73-75 creates a local electric field distribution that acts as a positive lens on the traversing electron beam 54. This serves to refract the local contour of the electron beam 54 in the radial-axial cross-section towards the optical axis A, and causes the distribution of the electron beam 54 to converge. Due to the radial variation of the electric field strength in the radial-angular plane, the positive lens effect may cause the electrons in the electron beam 54 to obtain a non-uniform axial speed distribution as viewed in the radial-angular plane (which causes for spherical aberration effects).

The strongly decreasing electric potential values applied to the sixth, seventh, eighth, and ninth collimator electrodes 76-79 create a local electric field distribution that acts as a negative lens on the traversing electron beam 54. This also refracts the local contour of the electron beam 54 in the radial-axial cross-section, but now away from the optical axis A. The variations in the radial distributions of the electron beam and the electric field may again contribute to spherical aberration effects.

A positive electric potential (with respect to a grounded reference) applied to the last collimator electrode 80 produces negative spherical aberration in the traversing electron beam 54 (or for a beam of negatively charged particles in general). The generated negative spherical aberrations will (at least partially) compensate any positive spherical beam aberration that has been generated in the preceding part of the collimator stack 70.

The voltage sources 151-160 are preferably set to create electric potentials on the collimator electrodes 71-80 so that a final local contour of the electron beam 54 is properly collimated as it emanates downstream from the beam generator 50 (i.e. the beam is made parallel in the radial-axial cross-section, at least as much as possible). The electric potentials created by the voltage sources 151-160 may be dynamically adjusted, in order to alter the distribution of the electrical potential values along the axial direction and/or to alter the local amplitudes of the electric fields. The axial centers of the positive and negative lenses may thus be moved along the axial direction, and/or the field amplitudes changed. The independent adjustability of the electric potentials applied to the collimator electrodes 71-80 during operation facilitates reconfiguration and optimization to changing operational conditions (e.g. beam current, vacuum conditions, shielding conditions, etc.)

The method may further comprise: —keeping a second collimator electrode 72 preceding the middle electrode 75 at a negative electric potential. In addition, the method may also comprise—keeping at least one of two intermediate collimator electrodes 78, 79 directly preceding the last collimator electrode 80 at low negative electric potentials. Applying a negative electric potential at one or two of the last intermediate collimator electrodes 78-79 preceding the last collimator electrode 80 helps to deflect secondary electrodes and/or backscattered electrodes originating from a region downstream of the collimator electrode stack 70. Secondary electrons may for example be created during collisions of primary electrons in the electron beam 54 with the aperture array 58.

The local negative electric potential helps to reduce the number of electrons that impact on the strongly positively charged middle collimator electrode 75.

According to the above mentioned specific numerical examples, further embodiments of the method for operating a beam generator 50 may comprise: —keeping at least one of two intermediate collimator electrodes 78, 79 directly preceding the last collimator electrode 80 at a fixed electric potential with a value of −300 Volts to −500 Volts; —keeping the second collimator electrode 72 at a fixed electric potential with a value of −3 kilovolts to −4 kilovolts; —keeping the middle collimator electrode (75) at a fixed electric potential with a value of +20 kilovolts to +30 kilovolts, and —keeping a last collimator electrode 80 at a positive potential in a range of +500 Volts to +1100 Volts.

First Cooling Arrangement Embodiment

FIGS. 7a-7d show cross-sectional top and side views of collimator electrodes 71-80 according to embodiments. The shown collimator electrodes 71-80 are provided with a cooling conduit 105 for transferring a cooling liquid 102, the cooling conduit 105 comprising a first opening 103 for connection to a liquid supply structure 117, and a second opening 104 for connection to a liquid discharge structure 118.

The presence of a cooling conduit 105 may further improve the accuracy and reliability of electric field control, as thermally induced deformation of the collimator electrode 71-80 may be regulated. The cooling conduit 105 may reduce expansion of the collimator electrode 71-80 due to thermal heating, for example caused by exposure to scattered and/or secondary electrons. Electrical conductance within the cooling liquid 102 is to be minimized, to avoid electrical charge accumulated on at least one of the collimator electrodes to be transported toward other collimator electrodes in quantities that are sufficiently large to alter the electrical potentials applied to the electrodes. Although more powerful charge sources may be used to compensate for any charge transport via the cooling liquid, such charge dissipation is less desirable due to the resistive heating from the resulting current through the cooling liquid, which negatively influences the liquid's cooling capacity. Electrical separation may be achieved by using ultra-pure water (UPW) or non-conducting oil as a cooling liquid. Preferably, UPW is constantly or intermittently filtered during operation of the particle beam generator 50.

As shown in FIGS. 7a-7d, the collimator electrodes comprise a ring-shaped electrode body 81 (primes for the various embodiments are implied wherever applicable) provided with a top surface 83 facing the charged particle source 52, and a bottom surface 84 facing away from the charged particle source 52. The bottom surface 84 and top surface 83 are connected to each other via a side surface 85, which defines an outer electrode perimeter. The first opening 103 and the second opening 104 are located in the side surface 85. Locating the first opening 103 and the second opening 104 of the cooling conduit 105 in the side surface 85 helps to keep the space between the different collimator electrodes 71-80 in the stack 70 free from potentially interfering (i.e. electric field perturbing) structures. In particular, since the cooling liquid supply and/or removal occur from a lateral side of the electrodes 71-80, the liquid supply structure 117 and/or liquid removal structure 118 do not need to occupy any space between the collimator electrodes 71-80.

The first opening 103 and the second opening 104 are located at the same side of the collimator electrode 71-80. Locating the first and second openings 103, 104 at the same side allows for placement of both the cooling liquid supply structure 117 and the cooling liquid discharge structure 118 at the same side of the collimator stack 70, which provides more space for other components to be placed alongside/around the collimator stack 70.

The cooling conduit 105 connects the first opening 103 with the second opening 104 along a trajectory running through the electrode body 81 around the electrode aperture 82. The cooling conduit 105 comprises a substantially circular portion 105a around the aperture 82 and two substantially straight end portions 105b for connecting the circular portion 105a with the first opening 103 and the second opening 104. This arrangement is particularly favorable if the electrode aperture 82 is a circular aperture. Here, the substantially circular conduit portion 105a traces out a trajectory at a constant distance from the aperture perimeter 82a, which results in more homogeneous cooling of the center portion of the collimator electrode 71-80.

The cooling conduit 105 is formed by a tubular structure, with tube openings 103, 104 that are oriented in radial directions. A relatively strong thermally and electrically conductive material is preferred as construction material for the cooling tube. Titanium for example, is a strong metal non-magnetic metal. A titanium cooling tube 105 provided in/on the collimator electrode body 81 will not generate significant magnetic field disturbances or magnetic stresses in response to the flux of the (nearby) charge particles travelling along the optical axis. Furthermore, titanium has a relatively high melting temperature (about 1940 Kelvin), which makes it a very suitable metal for manufacturing cooling conduits 105 inside a collimator electrode, by casting the collimator electrode body 82 from a metal of a substantially lower melting point (e.g. aluminum, having a melting temperature at about 930 Kelvin) around the titanium cooling tube 105. Alternatively, molybdenum may be used as a material for constructing the cooling tubes.

The cooling tube 105 may have a circular cross section, for achieving a relatively homogeneous liquid flow inside. An outer diameter of such a circular cooling tube 105 may be in the range of 0.6 centimeter to 1 centimeter, and a corresponding inner diameter in the range of 0.4 centimeter to 0.8 centimeter.

Figure 7A:
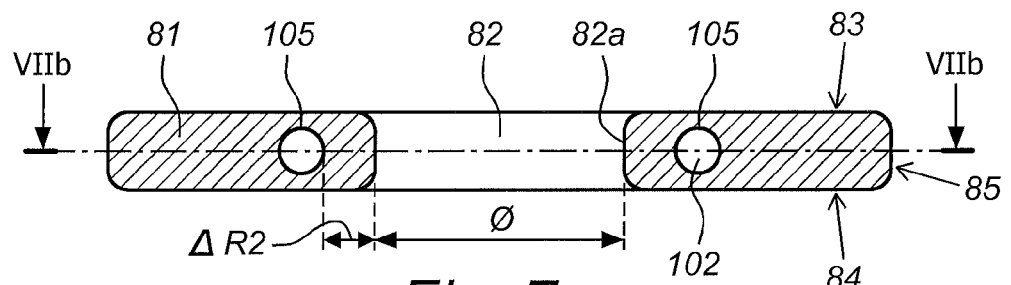
FIGS. 7a-7d shown cross-sectional top and side views of collimator electrodes according to embodiments.
Figure 7B:
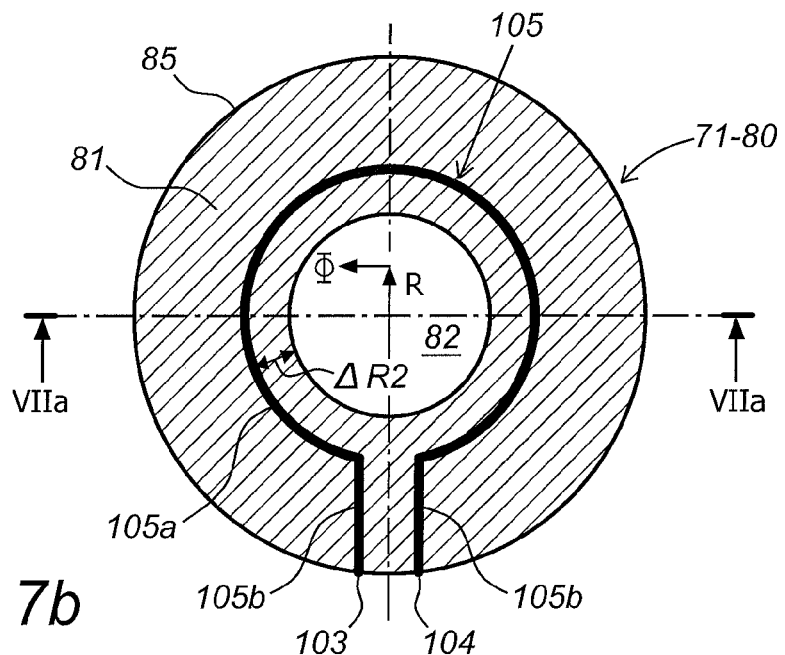

As shown in FIG. 7a, the conduit tube 105 may be integrated (e.g. cast) within the body 81 of the collimator electrode 71-80. Integral formation improves the cooling efficiency. Furthermore, by integrating the tubes within the electrode, the tubes will not protrude from the body surface and create local electric field concentrations, which would otherwise perturb the desired field distribution across the electrode aperture 82. The probability for sparking between the electrodes 71-80 is also reduced (which would not be the case for conduit tubes positioned on top of or protruding from the electrode surface). Moreover, having conduit tubes 105 integrated within the collimator electrode body 81 will increase the lateral space (i.e. mean free path) available for free molecules moving in the collimator stack 70 to travel radially outward and be removed e.g. absorbed by getter pumps 122, 123 positioned radially outward at a distance from the collimator stack 70. In the case that thermal heat transfer efficiency between the collimator electrode and the cooling liquid 102 has to be maximized, it is preferred that the electrode is formed via casting of electrode material around the cooling conduit 105.

The circular portion 105a the conduit tube 105 is preferably located at a sufficient radial conduit distance ΔR2 away from the aperture perimeter 82a of the electrode aperture 82. This ensures that the cooling effect of the cooling liquid 102 flowing through the circular portion 105a of the cooling conduit 105 stays relatively homogeneous along the angular coordinate (i.e. the temperature difference between the inflowing liquid and outflowing liquid stays relatively small), so that the differential thermal expansion of the electrode body 81 stays roughly the same as a function of the angular coordinate.

For example, for collimator stack embodiment with aluminum collimator electrodes (with a typical bulk thermal conductivity of 237 Watts per meter Kelvin) comprising electrode apertures 82 with an aperture diameter Ø of about 60 millimeters, which have an electrode thickness of about 13.6 millimeters, which accommodate a flow of water as cooling liquid, and in which at least one of the collimator electrodes is heated up with a temperature increase of up to 60° C. during operation, the radial conduit distance ΔR2 is preferably chosen to be 20 millimeters or larger. Note that in this example, a typical total diameter of the circular conduit portion 105*a* will be 100 millimeters or larger.

Figure 7C:
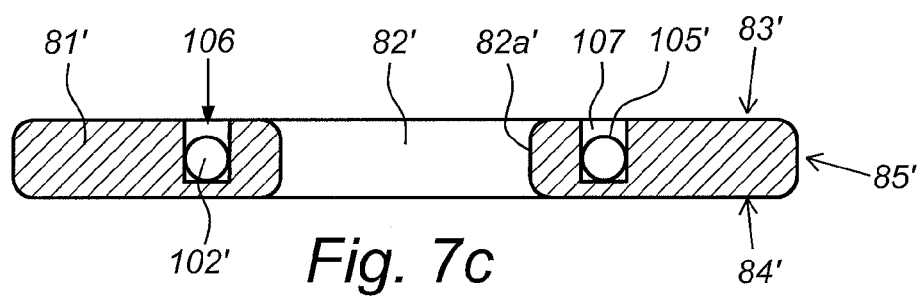

Alternatively, as shown in FIG. 7*c*, the conduit tube 105 may be accommodated inside a recess 106 provided in the electrode body 81' on a top side 83' thereof. Milling a recess 106 into the electrode body 81' and placement of the conduit tube 105 therein is a relatively cheap method for manufacturing a electrode. A thermally conducting adhesive material 107 may be provided in the recess 106 around the cooling tube 105, in order to fix the tube to the electrode body 81' and increase the effective thermal transfer interface. Attaching the conduit tube in the recess will also reduce local mechanical resonances propagating along the tube 105.

Figure 7D:
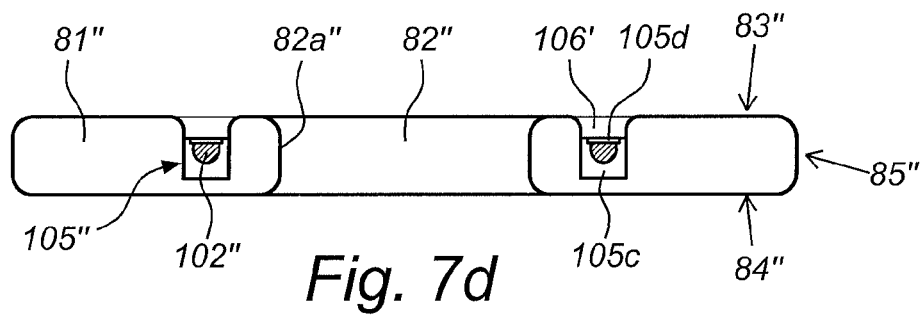

In yet another embodiment, which is shown in FIG. 7*d*, the conduit tube 105" may have a rectangular outer cross section, i.e. a rectangular outer perimeter as viewed in a cross-section along the radial-axial plane. This conduit tube 105" is also accommodated inside a recess 106' provided inside the electrode body 81" and with an opening on a top side 83' thereof. The recess 106' is provided with a complementary rectangular contour in an (axially) inner portion of the recess, to accommodate the rectangular conduit tube 105" in a manner that improves the thermal contact between lower and lateral sides of the conduit tube 105" on the one hand, and the lower and lateral sides of the recess 106' on the other hand. In this embodiment, the conduit tube 105" comprises a lower gutter portion 105*c* with a curved inner void for accommodating the cooling liquid 102", and a flat upper lid portion 105*d* for closing the curved inner void in a sealing manner (e.g. by laser welding the upper lid portion 105*d* onto upright lateral walls of the lower gutter portion 105*c*). An (axially) outer portion of the recess 106' may have a fillet (rounded) shape, to facilitate insertion of the conduit tube 105" into to recess 106'.

In any of the embodiments, intermediate conduits (e.g. tubular elements) 110 are provided for connecting a second opening 104 of a collimator electrode with a first opening 103 of a subsequent collimator electrode of the electrode stack 70. Using intermediate tubular elements 110 provides the ability to cool more than one collimator electrode within the collimator stack 70, while only a single cooling liquid supply structure 117 and cooling liquid removal structure 118 are needed for supply and removal of cooling liquid respectively. If more than one collimator electrode of the collimator electrode stack 70 is to be cooled, this embodiment is relatively easy to implement.

In the embodiment of FIG. 3, the intermediate tubular element 110 is made of an electrically insulating material e.g. aluminum oxide. This prevents the electrodes (between which a liquid connection is established) from becoming electrically connected (i.e. becoming electrical equipotential surfaces). Such electrical connection would counteract the initial purpose of having distinct electrodes. In alternative embodiments, the intermediate tubular elements may comprise portions made of electrically conducting material and coupling portions made of electrically insulating material (see e.g. FIG. 14).

In the embodiment shown in FIG. 3, the cooling conduits 105 in the collimator electrodes 71-80 are connected in series, to convey the cooling liquid sequentially through subsequent collimator electrodes 71-80. The supply conduit opening 103 of the last collimator electrode 80 is connected to a cooling liquid supply tube 117, for conveying the cooling liquid into the collimator stack 70. The discharge conduit opening 104 of the first collimator electrode 71 is connected to a cooling liquid discharge tube 118, for conveying the cooling liquid out of collimator stack 70. A cooling liquid pump 116 (with a heat extraction means) is provided on an outside of the beam generator chamber 51. The supply tube 117 and discharge tube 118 penetrate the beam generator chamber 51 at a predetermined location and in an air-tight manner. On the outside of the beam generator chamber 51, the supply tube 117 and discharge tube 118 are coupled with supply and discharge ports (not indicated) of the cooling liquid pump 116. On the inner side of the beam generator chamber 51, the supply tube 117 and the discharge tube 118 are provided with further bellow structures 119 for damping motional fluctuations, so as to prevent transient forces and mechanical resonances from the outer side to be conveyed via the supply and discharge tubes 117, 118 to the collimator stack 70. Preferably, the further bellow structures 119 are shorter than a tube diameter, to effectively attenuate vibrations.

According to the shown embodiment, the cooling liquid is preferably initially pumped into the collimator stack 70 at the downstream region (i.e. supplied to the last electrode 80), and the heated cooling liquid is pumped out of the collimator stack 70 at the upstream region (i.e. discharged from the first electrode 71). This arrangement produces a net flow of the cooling liquid along the negative axial direction −Z. In many applications, collimator electrodes located downstream of the electrode stack 70 are subject to more collisions and absorption of backscattered and/or secondary electrons, which results in a higher heat load. Initial supply of the cooling liquid to the downstream electrodes, and subsequently conveying the (warmed up) cooling liquid to the more upward electrodes, is preferred here to provide a more efficient heat exchange between the heated electrodes and the cooling liquid.

Also shown in FIG. 3 is that the intermediate tubular element 110 comprises a first substantially straight portion 111 radially facing away from the first opening 103, a second substantially straight portion 112 radially facing away from the second opening 104, and a substantially curved portion 113 connecting the first straight portion 111 with the second straight portion 112. An intermediate tubular element 110 comprising these straight portions 111, 112 and curved portion 113 in between reduces the risk of buckling, and more securely guarantees continuous transfer of cooling liquid through the intermediate tubular element 110. The intermediate tubular element 110 may be provided with at least one bellows structure 114. The bellows 114 enables motional compensation for any differential thermal deformations between the collimator electrode and the adjacent collimator electrode. Inhomogeneous heating of these electrodes and the resulting deformation differences will not result in exertion of additional stresses between the electrodes via the intermediate tubular element 110. The bellows structure 114 also assist in damping/eliminating mechanical vibrations that are coupled into the collimator stack 70.

Vacuum Pumping System Embodiment

Figure 8:
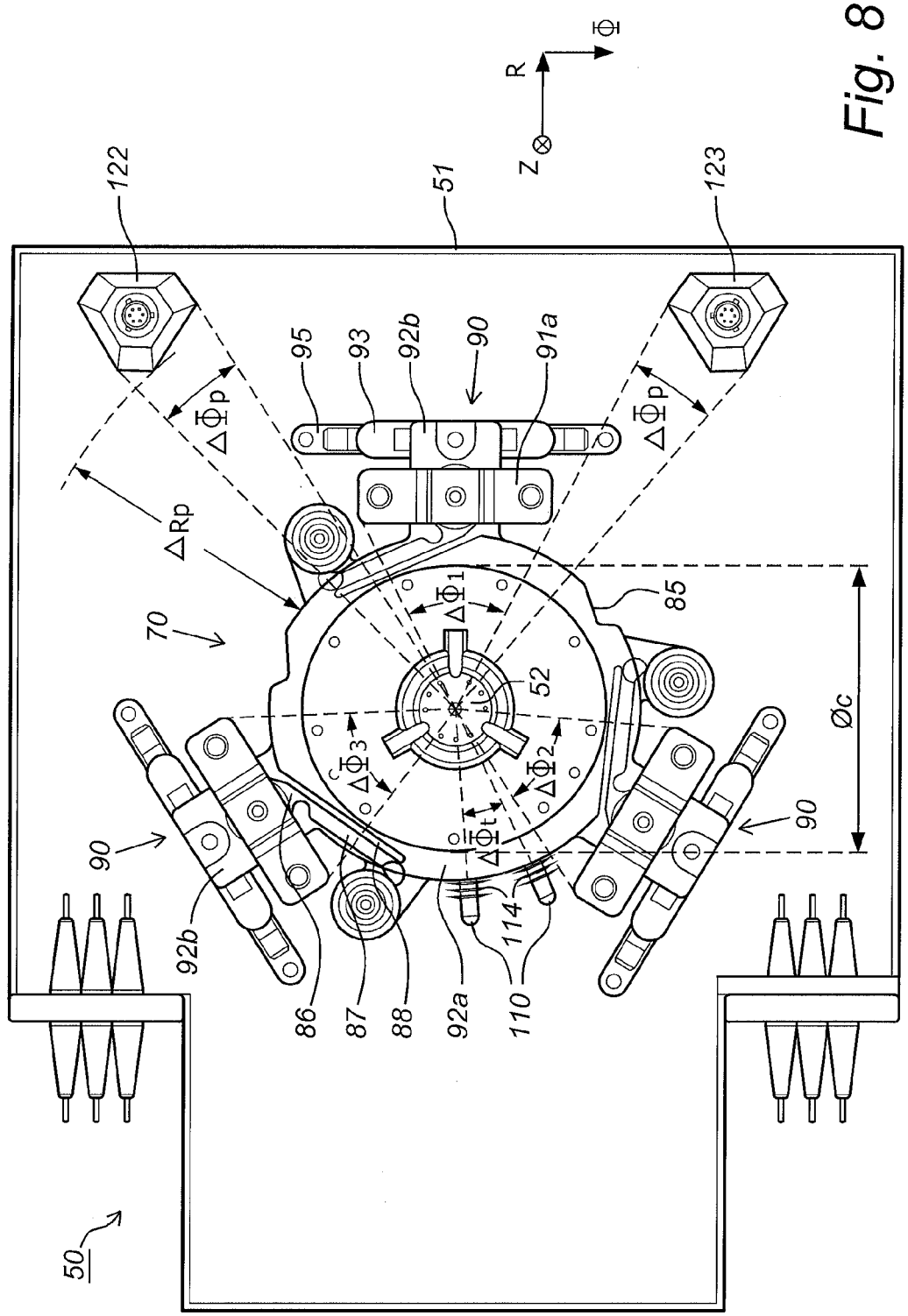
FIG. 8 shows a detailed top view of a beam generator according to an embodiment.

FIG. 8 shows a detailed top view of a beam generator according to an embodiment. This beam generator may comprise the charged particle source 52 and collimator stack 70 as discussed herein above.

The charged particle beam generator 50 is accommodated inside a beam generator vacuum chamber 51. The charged particle beam generator 50 comprises at least one vacuum pump unit 122, 123 provided at a distance ΔR from an outer perimeter of the collimator electrode stack 70. The vacuum pump unit 122, 123 forms an elongated structure with a pumping aperture 122a, 123a that is directed parallel with the optical axis, and which has an aperture height Hp that spans at least part of the collimator height.

In the embodiment of FIG. 8, the beam generator chamber 51 is provided with at least two vacuum pump units 122, 123, for sustaining a low vacuum inside the generator chamber 51 and the collimator stack 70 during operation. The vacuum pump units 122, 123 are provided at radial distances ΔR from the outer perimeter of the collimator electrode stack 70. The number of vacuum pump units may be increased to e.g. three or four, depending on the expected inflow of gas molecules from the environment into the beam generator chamber 51. The vacuum pump units 122, 123 sustain the vacuum by removing molecules travelling through the beam generator chamber 51. The pumping units 122, 123 may for example comprise two getter pumps, which remove free moving gas molecules from the beam generator chamber 51 via chemical reaction or surface adsorption.

Active pumping surfaces 122a, 123a of the pumping units 122, 123 extend along a substantial portion or preferably along the entire height Hc of collimator stack 70. A positioning of the pumping units 122, 123 with respective pumping surfaces 122a, 123a extending substantially along the height Hc of the collimator stack 70 yields a saving of the space within the beam generator chamber 51. The pumping apertures 122a, 123a preferably face the outer collimator perimeter (which is delineated by the outer perimeters 85 of the collimator electrodes 71-80).

The collimator electrode stack 70 comprises the three support columns 90 with the support portions 86. Each support column 90 (e.g. its support portions 86) extends over a respective angular range ΔΦ1, ΔΦ2, ΔΦ3 along the outer electrode perimeter 85. The pumping apertures 122a, 123a of the pumping unit 122, 123 each spans an angular pump range ΔΦp that has no overlap with either of the three angular ranges ΔΦ1, ΔΦ2, ΔΦ3. The shown configuration provides a good pumping efficiency.

The electrode stack 70 may comprise collimator electrodes 71-80 with cooling conduits 105 provided therein (i.e. "coolable collimator electrodes"). In this case, the electrode stack 70 also comprises intermediate tubular elements 110 for connecting a second opening 104 of a first collimator electrode with the first opening 103 of an adjacent collimator electrode. The intermediate tubular elements 110 are provided at the outer electrode perimeters 85, spanning a tube angular range ΔΦt. In addition to the above angular positioning properties for the pumping units 122, 123, the angular pump ranges ΔΦp of the pumping apertures 122a, 123a also have no overlap with the tube angular range ΔΦt.

Second Beam Generator Embodiment

Figure 9:
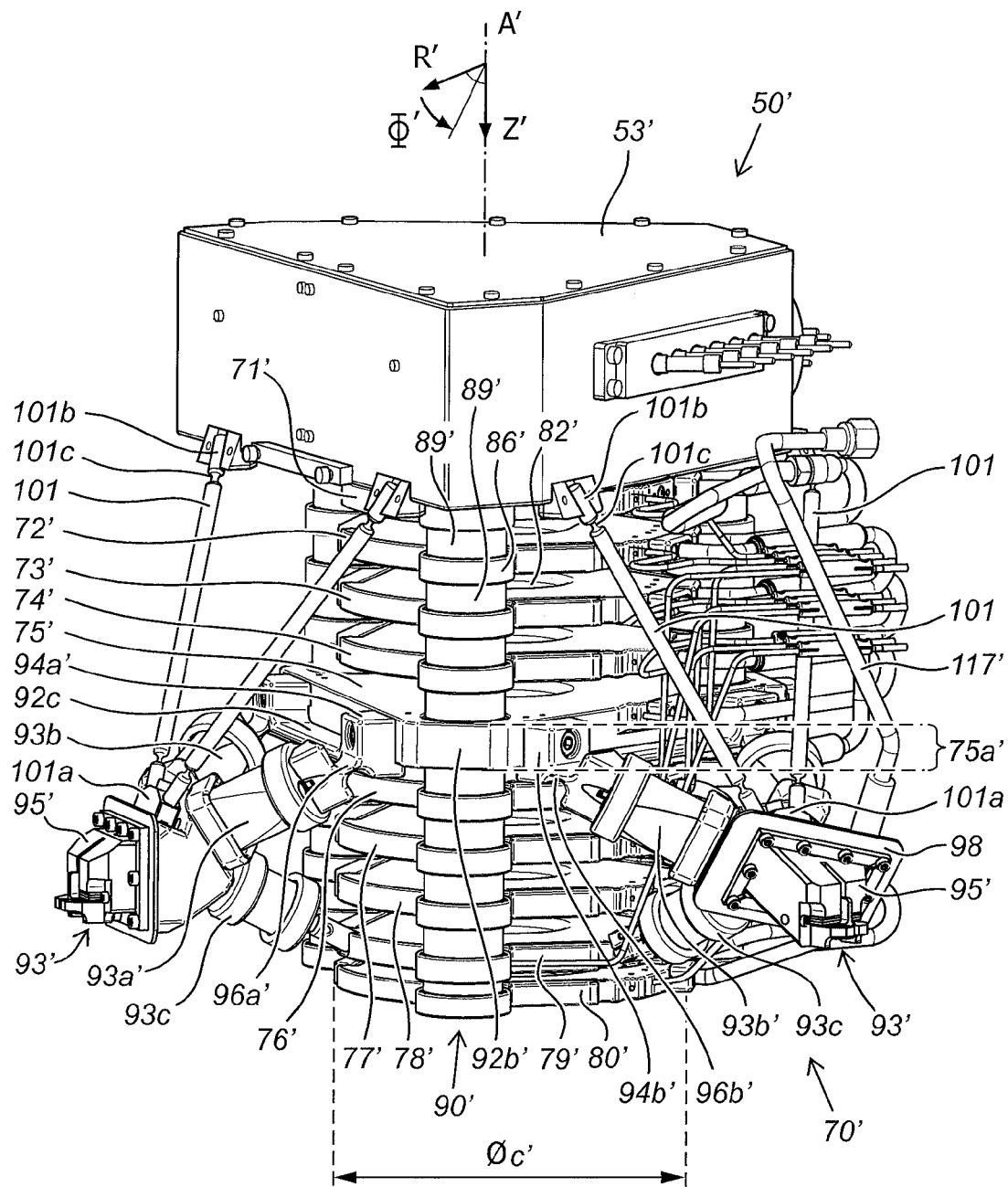
FIGS. 9-11 show perspective views of a beam generator according to another embodiment.

FIG. 9 shows a perspective view of a beam generator 50' according to another embodiment. Features and effects relating to the collimator electrode stack 70 described above (in particular with reference to FIGS. 3-8) may also be present in the embodiment of the collimator electrode stack 70' shown in FIGS. 9-13, and will not all be discussed here again. In the discussion of the beam generator 50' embodiment in FIGS. 9-13, similar reference numbers are used for similar features, but indicated by a prime to distinguish the embodiments.

The beam generator 50' in FIG. 9 comprises a collimator electrode stack 70' and a beam source vacuum chamber (or "source chamber") 53' enclosing a beam source 52' for generating a charged particle beam along an optical axis A'. The optical axis A' extends along an inner part of the collimator electrode stack 70'.

The collimator electrode stack 70' comprises ten collimator electrodes 71'-80', each having an electrode aperture 82'. The electrode apertures 82' are coaxially aligned along the optical axis A', and configured for electrically manipulating an electron beam that propagates substantially parallel with the axial direction Z' along the optical axis A'.

The first collimator electrode 71' is provided at an upstream end of the collimator stack 70'. The beam source 52' is fixed further upstream on or near an outer face of the first collimator electrode 71' (see FIG. 11). Each of selected collimator electrodes 71'-74', 76'-80' comprises three support portions 86' along an outer electrode perimeter. The support portions 86' accommodate spacing structures 89' on one side facing the axial direction Z'. The support portions 86' may further accommodate another spacing structure 89' on the opposite side facing the negative axial direction −Z'. The spacing structures 89' are electrically insulating and resistant against mechanical compression. The spacing structures 89' may be formed as cylindrical objects with a uniform spacer height and flat end surfaces that support or are supported by the electrode support portions 86' of adjacent electrodes 71'-74', 76'-80'.

In the shown embodiment, three such spacing structures 89' are arranged between each adjacent pair of electrodes. Preferably, three spacing structures 89' form a tripod configuration. The spacing structures 89' are located at substantially equal radial distances away from the optical axis A', and are mutually spaced at angular distances of about 180° degrees about the optical axis A'. The arrangement of spacing structures 89' and support columns 90' is further explained below, with reference to FIG. 13.

The collimator electrode stack 70' comprises three stack support legs 93'. Each support leg is connected to a middle region 75a' of the collimator stack 70' with respect to the axial direction Z'. The support legs 93' cooperate to support the collimator stack 70' with respect to an external reference frame, which may be formed by the carrier frame 42 of the charged particle lithography system 10 in FIG. 1. The resonance regularization effects described for the collimator electrode stack of FIG. 4 are also achievable by the currently described collimator configuration.

The middle region 75a' of the collimator stack 70' is selected to correspond to the middle collimator electrode 75', which in this case is the fifth collimator electrode 75' counted downstream, starting from the source 52' and proceeding along the axial direction Z'. The middle collimator electrode 75' comprises an electrode body formed by a mechanically strong triangular slab with three corners 92b' and three intermediate electrode body edges 92c. Each corner 92b' accommodates a spacing structure 89' on one side towards the axial direction Z' and another spacing structure 89' on the opposite side towards the negative axial direction −Z'.

Figure 10:
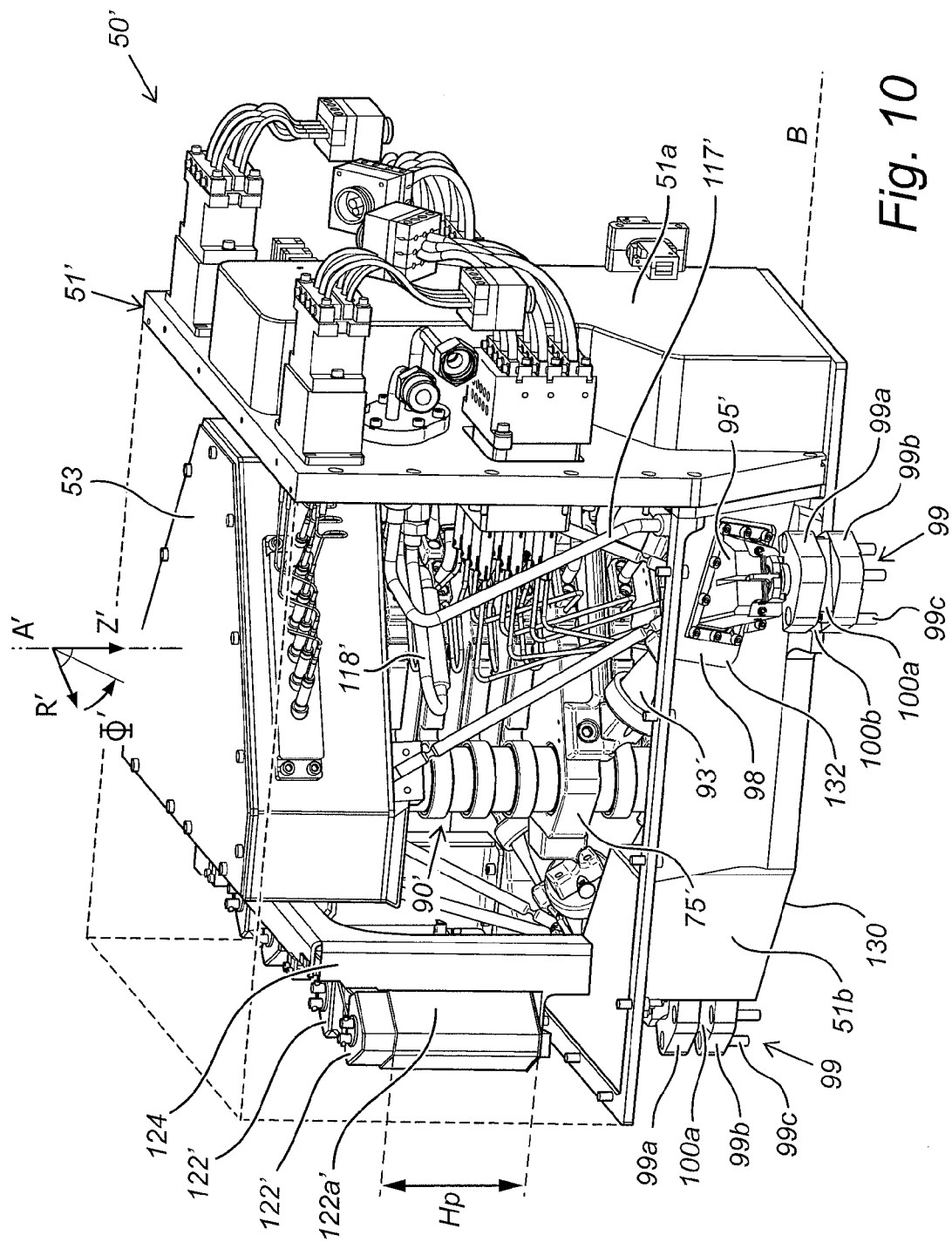
Figure 11:
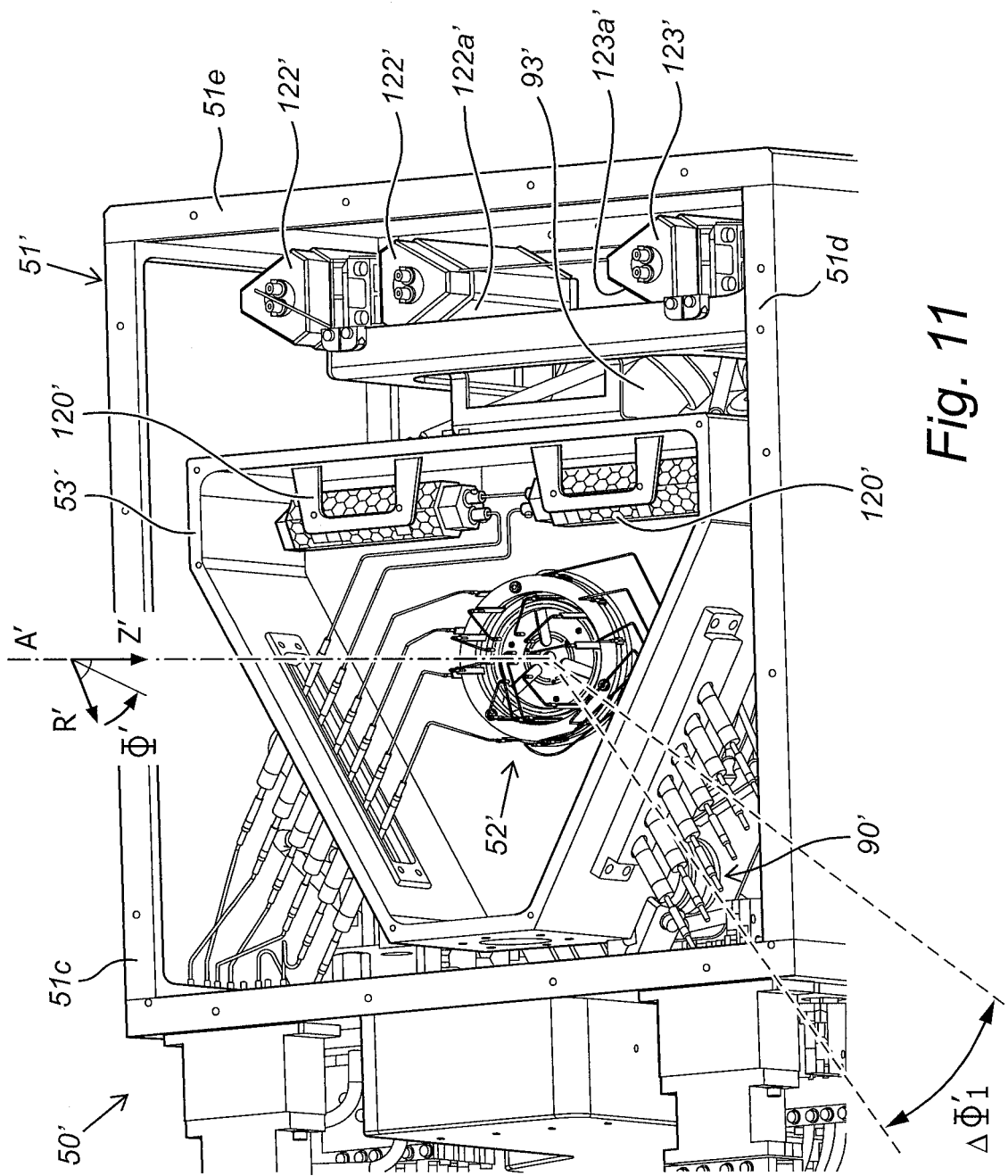

Each stack support leg 93' is connected to a respective electrode body edge 92c. In the embodiment of FIGS. 9-11, each stack support leg 93' comprises a radially protruding tripod 93a'-96c' that is connected to the collimator stack 70' in three distinct regions. The stack support leg 93' comprises a leg base 95' with a support foot 99 for connecting the support leg 93' to the external reference frame. The stack support leg 93' comprises first and second leg members 93a'-93b' that extend radially inward and in locally opposite angular directions from the leg base 95' towards the middle stack region 75a'. The stack support leg 93' comprises two leg joints 94a'-94b' for connecting the first and second leg members 93a'-93b' to the middle stack region 75a', e.g. to a corresponding electrode body edge 92c' of the fifth electrode 75'. In this embodiment, the leg joints 94a'-94b' are level with an upper surface of the electrode body, to conserve the angular symmetry of the electric field generated by the fifth electrode 75'.

Each stack support leg 93' may also comprise a third leg member 93c that extends from the leg base 95' towards one of the lowermost electrodes 79'-80' in the electrode stack 70'.

The leg members 93a'-93c are preferably made of mechanically rigid material. At least an intermediate portion of each leg member 93a'-93c' is essentially made of electrically insulating material, to electrically insulate the supported electrodes from each other as well as from the leg base 95'. Each of the first and second leg members 93a'-93b' comprises a radial deflection portion 96a'-96b', which is configured for allowing the corresponding leg joint 94a'-94b' to displace in the radial direction R' with respect to the leg base 95'. In the embodiment of FIG. 9, the radial deflection portions 96a'-96b' comprise beams with a curved I-shaped cross-section, which defines a flexible narrow middle region. Each I-beam is oriented mainly transverse to the (local) radial direction, and allows the I-profile to flex within the (local) radial-axial plane while remaining mechanically stiff in the (local) angular direction.

As shown in FIG. 10, the leg base 95' is connected to the support foot 99, which comprises a first support foot portion 99a and a second support foot portion 99b. The support foot portions 99a-99b form distinct bodies that are moveably arranged with respect to each other. The support foot portions 99a-99b may be interconnected by a resilient member 100 positioned between the first support foot portion 99a and the second support foot portion 99b. The resilient member 100 permits the first and second foot portions 99a-99b to mutually displace within a predetermined range. The resilient members 100 may for example be formed by two leaf springs 100a-100b that both extend parallel with the axial direction Z' and the (local) angular direction Φ'. The two leaf springs 100a-100b are oriented mutually parallel at different radial distances from the optical axis A'. Each leaf spring faces substantially towards the radial direction R' (i.e. has its sheet surface normal pointing at least partially in the radial direction R'). Each of the leaf springs 100a-100b of one support foot 99 separately allows resilient flexing along radial-axial directions. The leaf springs 100a-100b jointly allow the first foot portion 99a and the second foot portion 99b to elastically flex along the radial direction R' in a parallelogram fashion. This allows the first foot portion 99a to retain its orientation during radial flexing with respect to the second foot portion 99b (and the external reference frame). The leaf springs 100a-100b may for example be constructed of sheet steel.

The described stack support configuration allowed radial displacements between the leg joints 94a'-94b' and the corresponding leg bases 95' of each stack support leg 93', as well as radial displacements between the first foot portion 99a and the second foot portion 99b of each stack support leg 93'. The cooperating three stack support legs 93' yield a stack support configuration that may conveniently accommodate differential radial deformation of the middle electrode 75' with respect to the leg bases 95', while keeping the collimator electrode stack 70' aligned along the optical axis A'.

The support foot 99 may comprise one or more adjustment members 99c for fine-tuning a height of the corresponding support leg 93'. By separately varying the support heights of the three support legs 93', the total height and tilt of the collimator stack 70' with respect to the external frame 42 may be accurately adjusted.

The leg base 95' may also comprise a gasket 98 that cooperates with a surrounding beam generator chamber 51' in a manner described herein further below.

In the embodiment of FIGS. 9-13, the source vacuum chamber 53' encloses the beam source 52'.

The source vacuum chamber 53' is formed by chamber walls with a cross-section defined in the radial-angular plane that has a predominantly triangular shape with three chamfered corners. The resulting irregular hexagonal cross-sectional shape of the walls of the vacuum source chamber is arranged in such a manner that the three chamfered wall corners are aligned with the three support columns 90' of the underlying collimator stack 70'. The collimator electrode stack 70' and the source vacuum chamber 53' are not directly mechanically connected. Similarly, the beam source 52' and the source vacuum chamber 53' are not directly mechanically connected. Instead, the first collimator electrode 71' comprises engagement members for fixing the charged particle beam source 52' to the first collimator electrode 71' on an upper side thereof, and source alignment members for orienting the optical axis A' of the generated charged particle beam with a centerline of the electrode apertures 82'.

Each stack support leg 93' comprises two chamber support members 101 for aligning and supporting the source vacuum chamber 53'. Is this embodiment, each chamber support member is formed by an elongated support rod 101, which extends from a leg connection 101a at the corresponding leg base 95 towards a chamber connection 101b that locally supports the source chamber 53'. At least one narrowing 101c may be provided along the support member 101, to accommodate thermal differential expansion. The embodiment shown in FIGS. 9-10 comprises six such support rods 100, which extend upwards and radially inwards.

The support configuration shown in FIG. 9 allows the beam source chamber 53' and the collimator electrode stack 70' to be supported on the same external reference frame 42 via the same support structure 93'-101c, while avoiding direct mechanical coupling between the beam source chamber 53' and the collimator electrode stack 70'. This support configuration may advantageously reduce effects of pressure-induced deformations in the beam source chamber 53' on the alignment of the collimator stack 70'. Conversely, the support configuration may advantageously reduce effects of thermally induced deformations of the electrode stack 70' on the geometry of and vacuum conditions inside the source chamber 53'. Alternatively or in addition, the proposed support configuration mechanically decouples the extra weight and size of the source chamber 53' from the collimator electrode stack 70', thereby reducing or even eliminating the contribution of the source chamber 53' to the mechanical resonance (eigen-)frequencies of the collimator electrode stack 70'. The resulting mechanical resonance frequencies for the collimator stack 70' thus become higher and more localized in frequency space. The proposed support configuration for decoupling the source vacuum chamber 53' and the electrode collimator stack 70' may be implemented as a separate improvement, independently from the mechanical decoupling solution between the electrode collimator stack 70' and the beam generator vacuum chamber 51', which is discussed directly below.

Second Vacuum System Embodiment

FIGS. 10-11 show perspective views of the beam generator embodiment 50' including a beam generator vacuum chamber (or "generator chamber") 51' and vacuum pumping systems. Features and effects relating to the beam generator 50 with generator chamber 51 in FIG. 8 may also be present in the beam generator 50' with generator chamber 51' described below, and will not all be discussed here again. In the discussion of the embodiment in FIGS. 10-11, similar reference numbers are used for similar features, but indicated by a prime to distinguish embodiments.

The beam generator vacuum chamber 51' is only partially shown in FIGS. 10-11. In FIG. 10, only a rear chamber portion 51a and a lower chamber portion 51b of the beam generator chamber 51' are depicted. An upper chamber portion and lateral chamber portions form part of the complete beam generator chamber 51', but are omitted from FIG. 10 to show the charged particle beam generator 50' inside the generator chamber 51'. Lateral chamber portions 51c-51e of the generator chamber 51' are depicted in FIG. 11.

The beam generator vacuum chamber 51' is provided with vacuum pump units 122'-123' (e.g. getters) for sustaining a low vacuum inside the generator chamber 51' during operation. The vacuum pumps 122'-123' are attached to a pump support structure 124, and oriented with their body axes substantially parallel with the axial direction Z. The pump support structure 124 has curved surface portions that face substantially towards the collimator stack 70' (viewed along the radial direction R). The vacuum pumps 122'-123' are attached on a surface portion of the pump support structure 124 that faces substantially away from the collimator stack 70'. The electric shielding by the pump support structure 124 and the outward direction of the vacuum pumps 122'-123' help to reduce the perturbing effects of e.g. the polygonal shape of the vacuum pumps 122'-123' on the electric fields created inside the collimator stack 70'.

Each support column 90' of the collimator electrode stack 70' extends over a respective angular range $\Delta\Phi1'$, $\Delta\Phi2'$, $\Delta\Phi3'$ along the outer electrode perimeter. Only the range $\Delta\Phi1'$ is shown in FIG. 11. The configuration with clamping members 91a'-91b' inside aligned through holes in each support column 90' advantageously reduces a column width and therefore also the angular range $\Delta\Phi1'$, $\Delta\Phi2'$, $\Delta\Phi3'$ over which each support column 90' extends. The reduced column width yields a larger window for molecules inside the collimator region to travel without obstruction towards the vacuum pump units 122'-123', resulting in a higher pumping efficiency.

Below, a mechanical decoupling mechanism between the collimator electrode stack 70' and the beam generator chamber 51' is described.

As viewed along the axial direction A', the stack support legs 93' of the collimator electrode stack 70' extend radially outward and protrude beyond an outer perimeter of the collimator electrodes 71'-80'. Also viewed along the axial direction A', the lower vacuum chamber portion 51b of the generator chamber 51' delineates an outer chamber perimeter 130 that extends beyond the outer perimeter of the collimator electrodes 71'-80' (provided that the collimator electrode stack 70' is positioned inside the generator chamber 51'). At the angular coordinates of the stack support legs 93', the outer chamber circumference 130 is "inscribed" with respect to the stack support leg bases 95' (i.e. the outer chamber perimeter 130 locally lies at a smaller radial distance from the optical axis A' than the leg bases 95' do).

To accommodate the protruding stack support legs 93', the lower vacuum chamber portion 51b is provided with three lateral chamber apertures 132 in the chamber wall. The chamber apertures 132 are located at angular coordinates that correspond with the respective stack support legs 93'. Preferably, each lateral chamber aperture 132 has a shape that is complementary to a local outer perimeter of a corresponding support leg 93'. In the embodiment of FIG. 10, each lateral chamber aperture 132 has a predominantly rectangular shape to accommodate a corresponding leg base 95' with a locally rectangular cross-section. The lateral chamber apertures 132 are preferably shaped similar to (i.e. congruent with) the local perimeters (cross-sections) of the corresponding support legs 93', but other aperture shapes are possible, provided that the (local perimeter of the) support leg can be accommodated and that the support leg is allowed to protrude through the chamber wall while avoiding direct rigid connection with the wall of the generator chamber 51'.

As described herein above, the stack support members 93' may each comprise a gasket 98 for connecting to the surrounding generator chamber 93'. The gasket 98 is arranged and configured to flexibly connect the corresponding stack support member 93' to the lower vacuum chamber portion 51b along the edge of the lateral chamber aperture 132. In addition, the gasket 98 is formed to cover and seal a void between the lateral chamber aperture 132 and the support leg 93'. The resulting sealing configuration allows different vacuum conditions to be applied on both sides of the lateral chamber aperture 132 (i.e. on the inside and outside of the generator chamber 51'). In the embodiment of FIGS. 10-11, the gasket 98 of each stack support member 93' is formed by a flat rectangular washer made of synthetic rubber (more particularly, a vacuum-compatible fluoropolymer elastomer like Viton®), which surrounds the leg base 95' of the stack support member 93'.

The resulting beam generator configuration allows the accommodation of the collimator stack 70' on the inside of the generator chamber 51', while enabling the collimator stack 70' and the generator chamber 51' to be independently supported by the external reference frame. Direct rigid mechanical coupling between the collimator stack 70' and the generator chamber 51' is thereby avoided.

The proposed mechanical decoupling between the collimator stack 70' and the beam generator chamber 51' may advantageously reduce the effects of pressure-induced deformations of the generator source chamber 51' on the alignment of the collimator stack 70', and/or reduce effects of thermally induced deformations of the electrode stack 70' on the geometry of the generator chamber 51'.

Alternatively or in addition, the proposed mechanical decoupling may reduce or even eliminate the contribution of the generator chamber 51' to the mechanical resonance (eigen-)frequencies of the collimator electrode stack 70'.

Alternatively or in addition, the proposed beam generator configuration allows the collimator stack 70' to be operated under vacuum conditions created inside the generator chamber 51', while position and alignment of the collimator stack 70' can still be adjusted from outside the vacuum chamber 51'. This greatly facilitates alignment and performance testing of the collimator stack, and helps to improve beam accuracy.

The proposed support configuration with mechanical decoupling allows the construction of a generator chamber 51' that has relatively thin walls and low mass. The described beam generator embodiment 50' can therefore be conveniently formed as a module that is insertable into and removable from a carrier frame 42 provided inside a vacuum chamber 30 of a charged particle lithography system 10 (e.g. shown in FIG. 1).

As indicated herein above, either one of the proposed support configurations (i.e. for mechanically decoupling the beam generator chamber 51' and the electrode collimator stack 70' on the one hand, and for mechanically decoupling the source vacuum chamber 53' and the electrode collimator stack 70' on the other hand) may be implemented alone. The embodiment described with reference to FIGS. 9-10 nevertheless illustrates that these decoupling solutions may also be implemented together, by utilizing the same stack support structure and thereby keeping the required space and constructional complexity relatively low.

Both of the mechanical decoupling solutions may be considered distinct solutions, and neither of these solutions requires that the collimator stack supports 93'-96b are connected to a middle region 75a' of the collimator stack 70'. The described mechanical decoupling between the beam generator chamber 51' and the electrode collimator stack 70' may generally be applied in any beam generator that comprises a vacuum chamber with an electrode stack on an inside, and stack supports that are attached to a lateral region of the collimator electrode stack.

The embodiment described with reference to FIGS. 9-10 nevertheless illustrates that these decoupling solutions may be implemented together with collimator stack supports 93'-96b that engage in the middle region 75a' of the collimator stack 70', to beneficially lower resonance sensitivity of the collimator electrode stack 70' to all the three resonance frequency effects discussed herein above, while utilizing the same stack support structure and thereby keeping the required space and constructional complexity relatively low.

Figure 12:
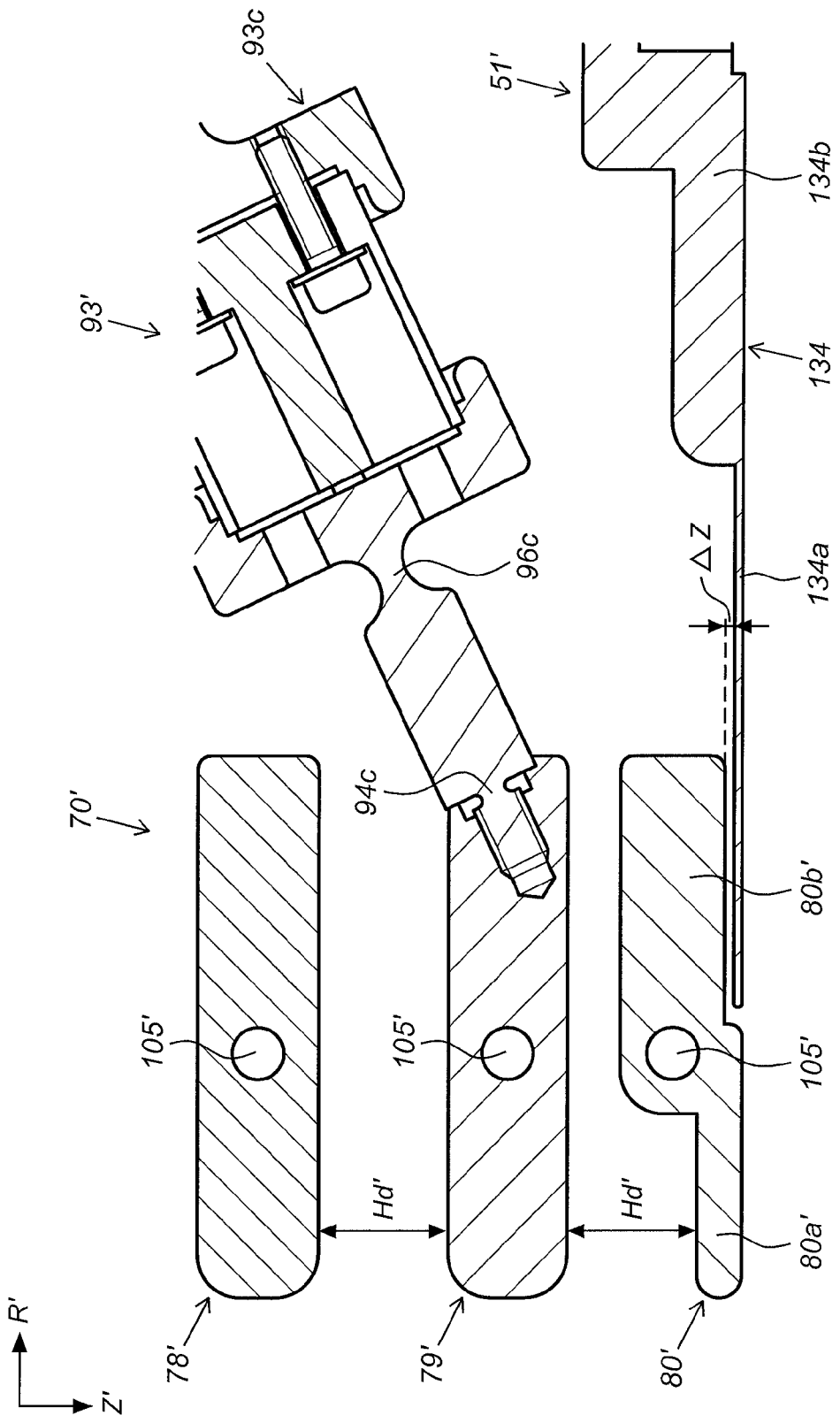
FIG. 12 shows a cross-sectional side view of a lower portion of a beam generator according to an embodiment.

FIG. 12 schematically shows that, on a lower (i.e. downstream) side of this second embodiment of the beam generator 50', the collimator electrode stack 70' and the beam generator chamber 51' are configured to remain mechanically separated. The beam generator chamber 51' and the collimator electrode stack 70' can thus remain separately supported by the external reference frame 42. FIG. 12 shows that the beam generator chamber 51' comprises bottom plate 134, which forms part of the lower chamber portion 51b shown in FIG. 10. The bottom plate 134 comprises a radially inner chamber plate portion 134a that is relatively thin and located radially proximate to the collimator electrode stack, and a radially outward chamber plate portion 134b that is thicker than the radially inner chamber plate portion 134a, and which is located radially closer to the outer chamber perimeter 130. The inner plate portion 134a is located proximate to the last collimator electrode 80'. In particular, the inner plate portion 134a is proximate to the radially inner electrode portion 80a' in the radial direction R', and proximate to the radially outer electrode portion 80b' in the axial direction Z'. A narrow gap AZ is defined between the inner plate portion 134a and the last collimator electrode 80'. This gap AZ preferably has a constant height along the radial direction R'. Preferably, the height of the gap AZ is approximately 0.5 millimeters or smaller.

Furthermore, the surfaces delineating this gap AZ preferably have smooth curvatures, in particular at a radially inward distal end of the inner plate portion 134a, to avoid electric discharge between the last collimator electrode 80' (which may be kept at an electric potential in the order of 1 kilovolt during operation) and the inner plate portion 134a of the beam generator chamber 51' (which is preferably kept at ground potential during operation).

The resulting support configuration allows the beam generator chamber 51' and the collimator electrode stack 70' to be independently supported by the external reference frame 42. For example the external reference frame 42 may support the beam generator chamber 51' at its bottom plate 134, whereas laterally protruding stack support legs 93' carry the collimator electrode stack 70' and are in turn supported outside the beam generator chamber 51' by the external reference frame 42.

FIG. 12 also illustrates that the stack support leg 93' may be connected to a penultimate collimator electrode 79', to increase stability. The stack support leg 93' comprises a third leg joint 94c for connecting the third leg member 93c' a body edge of the penultimate electrode 79'. The third leg joint 94c may for example be fixed to the penultimate collimator electrode 79' by means of a threaded connection, or other known methods. The third leg member 93c may comprise a third deflection portion 96c that permits the stack support leg 93 to accommodate differential thermal deformations between the middle collimator electrode 75' supported by the first and second leg members 93a'-93b' on the one hand (see FIG. 9), and the penultimate electrode 79' supported by the third leg member 93c on the other hand.

FIG. 12 furthermore illustrates that the inter-electrode heights Hd' between the collimator electrodes 78'-80' may be constant. In particular, the inter-electrode height Hd' between the penultimate electrode 79' and the radially inner electrode portion 80a' of the last electrode 80' preferably equals the inter-electrode height Hd' between the two-to-last electrode 78' and the penultimate electrode 79'.

Second Support Column Embodiment

Figure 13:
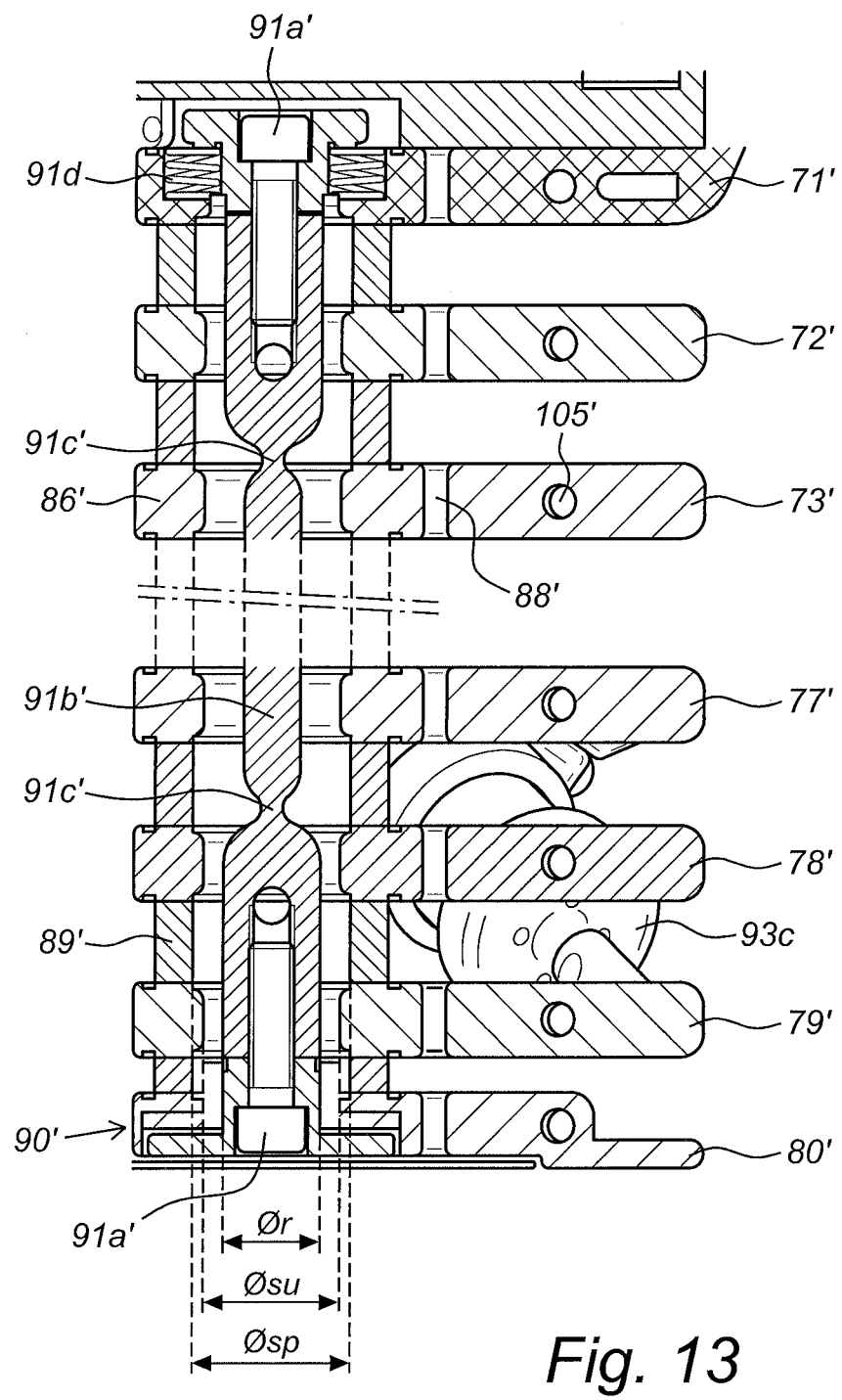
FIG. 13 shows a cross-sectional side view of a support column in a collimator electrode stack according to an embodiment.

FIG. 13 illustrates a configuration of the support columns 90' in the second collimator stack 70' embodiment. The electrode support portions 86' of adjacent collimator electrodes and interposed spacing structures 89' are axially aligned to define the stack support columns 90', which are oriented substantially parallel with the axial direction Z'. Three support columns 90' are formed in this embodiment. Each of the electrode support portions 86' and the spacing structures 89' is provided with a through hole, which is extends substantially parallel with the axial direction Z'. The through holes in each support column 90' are mutually aligned to form an integral column through hole. The aligned through holes of the support column 90' accommodate a clamping member 91a'-91d' for holding the support portions 86' and intermediate spacing structures 89' together. The clamping member comprises e.g. an axial pre-tensioned rod 91b' that pulls together the two distal ends 91a' of the pre-tensioned rod. The two distal rod ends 91a' are coupled to the first and last (i.e. outer) electrodes 71', 80' respectively. Each pre-tensioned rod 91b' is provided with two narrowings 91c', to accommodate differential thermal deformation between the collimator stack 70' and the respective pre-tensioned rod 91b'. In addition, a spring member 91d may be provided on one or both distal rod ends 91a' of each pre-tensioned rod 91b', to provide an additional compensation mechanism for differential axial thermal deformation between the collimator stack 70' and the respective pre-tensioned rod 91b'. The clamping members 91a', 91b' are preferably made of a strong and non-magnetic material e.g. titanium. Sufficient radial interspacing is provided between an outer perimeter of each pre-tensioned rod 91b' and the inner perimeters of the through holes in the electrode support portions 86' inside which the pre-tensioned rod 91b' is accommodated.

In the case of cylindrical through holes and rods, inner diameters Øsu of the through holes in the support portions 86 and inner diameters Øsp of the through holes in the spacing structures 89 are both substantially larger than an outer diameter Or of the pre-tensioned rod 91b'.

The radial interspacing serves to maintain electrical separation between the respective electrodes 71'-80' on the one hand and each pre-tensioned rod 91b' on the other hand, even if the electrodes experience thermal radial deformations during operation of the collimator electrode stack 70'. Due to the required through holes inside the electrode support portions 86' of this embodiment, a typical diameter of the electrode support portion 86' will be larger than a diameter of an electrode support portion 86 in the collimator electrode embodiment shown in FIGS. 4-5, for example about 1.5 times larger.

Second Cooling Conduit Embodiment

Figure 14:
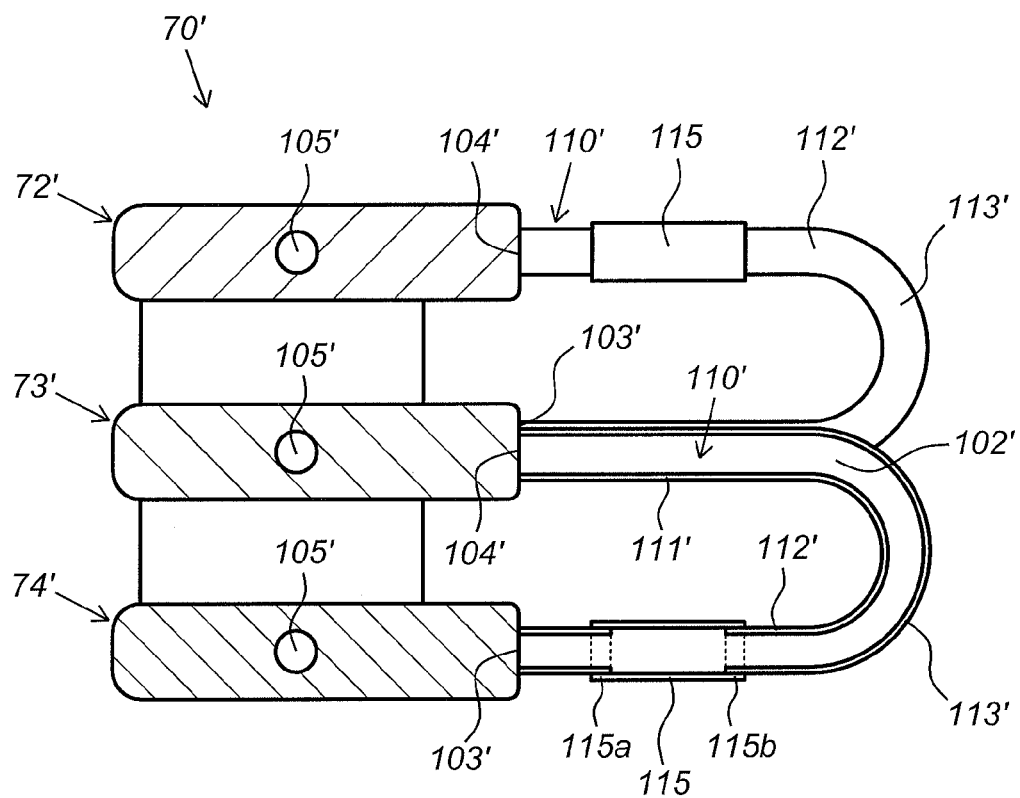
FIG. 14 shows a cross-sectional side view of cooling conduits in a collimator electrode stack according to an embodiment.

FIG. 14 schematically illustrates a portion of the cooling arrangement in the embodiment of the collimator electrode stack 70' shown in FIGS. 9-11. FIG. 14 shows the second, third, and fourth collimator electrodes 72'-74', which are formed as collimator electrodes that are each provided with a cooling conduit 105' on an inside of the electrode body. Interconnecting conduits (formed as intermediate tubular elements) 110' are provided between first conduit openings 103' of first electrodes (e.g. the fourth electrode 74') and second conduit openings 104' of second electrodes (e.g. the third electrode 73'). In this embodiment, each pair of interconnected electrodes are directly adjacent, and the resulting cascade of electrodes and interconnecting conduits forms a serial cooling arrangement. In this embodiment, each interconnecting conduit 110' comprises a first straight conduit portion 111', a curved conduit portion 113', and a second straight conduit portion 112'. In this embodiment, the conduit portions 111'-113' are made of a mechanically strong and non-magnetic material e.g. titanium. In contrast to the embodiment shown in FIG. 3, there are no conduit bellows provided between the conduit portions 111'-113'. Instead, at least one of the straight conduit portions 111'-112' of each interconnecting conduit 110' is provided with an insulating tube connector 115. The corresponding conduit portion 111'-112' is discontinued inside the insulating tube connector 115, and terminates at two distal conduit ends. These distal conduit ends are fixed to two opposite ends of the insulating tube connector 115 in a liquid tight manner, by means of insulating tube connectors 115a-115b. The insulating tube connectors 115a-115b may be formed by compression fittings with O-rings. The insulating tube connector 115 is made of an electrically insulating material (e.g. aluminum oxide), which provides electrical insulation between the interconnected conduit portions. The proposed conduit arrangement with insulating tube connector 115 ensures that electrical discharge between interconnected collimator electrodes is reduced.

Also in contrast to the embodiment shown in FIG. 3, the supply tube 117' and discharge tube 118' in the second cooling arrangement are not provided with further conduit bellows. Instead, the supply tube 117' and the discharge tube 118' (shown in FIGS. 9-10) have considerable lengths and are provided with curved regions for damping mechanical resonances originating from outside the beam generator 50'.

Third Collimator Stack Embodiment

Figure 15:
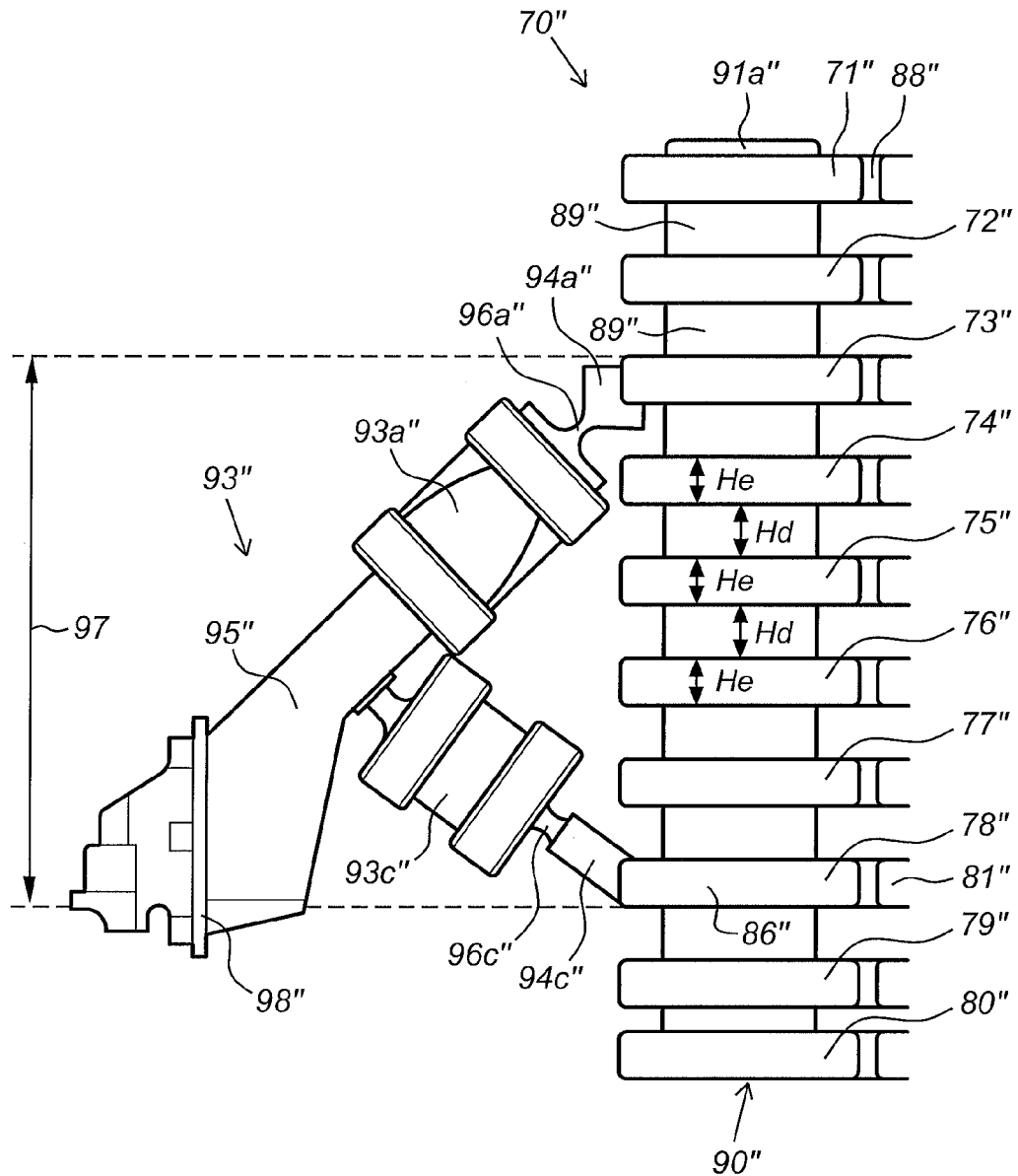
FIG. 15 shows a support system in a collimator electrode stack according to another embodiment.

FIG. 15 shows another embodiment of a collimator electrode stack 70" comprising a stack support system 93" for supporting the collimator electrode stack 70" with respect to an external reference frame (42, not shown), and connected to a lateral region 97 of the collimator electrode stack 70". The lateral region corresponds to the outward perimeter of the collimator stack 70", which faces predominantly outward along the radial coordinate. In this embodiment, one leg member 93a" of the stack support leg 93" engages with a third collimator electrode 73". A further leg member 93c' "of the stack support leg 93" engages with an eighth collimator electrode 78". In this embodiment, the heights He of the collimator electrodes 71"-80" are substantially equal. In addition, the inter-electrode distances Hd are substantially equal. The third collimator electrode 73" and the eighth collimator electrode 78" comprise electrode support portions 86" with electrode support arms that have sufficient mechanical strength to jointly support the weights of the entire collimator electrode stack 70" with respect to the stack support legs 93". As a result, also the third collimator electrode 73" and the eighth collimator electrode 78" comprise thermal expansion spaces 88" for accommodating differential thermal deformation between the electrode bodies 81" and the support portions 86", while keeping the support column 90" in a fixed position.

The descriptions above are intended to be illustrative, not limiting. It will be apparent to the person skilled in the art that alternative and equivalent embodiments of the invention can be conceived and reduced to practice, without departing from the scope of the claims set out below.

For example, the above descriptions of collimator electrode stack embodiments and charged particle beam generator embodiments suggest the presence of exactly three electrode stack support columns and three electrode stack support legs. Although the number three is preferred for high stability and constructional simplicity, configurations with only two columns and/or legs or with more than three columns and/or legs or are also conceivable.

The support legs in a collimator stack may engage with the spacing structures in the support columns, as an alternative or in addition to engaging the middle collimator electrode, to establish a balanced suspension with respect to an external reference frame.

The stack support system may be shaped differently from the described triangular and tripod leg structures. The stack support systems described in the above embodiments extended from the electrode stack predominantly downwards to the external reference frame. In general, the external reference frame (e.g. carrier frame 42) may support the electrode stack in the middle region via support members that may be oriented in any of a downward axial direction Z (compression stresses exerted on support legs 93 in FIG. 4), an upward axial direction −Z (tensile stresses exerted on support members), a radial direction R (bending stresses on support members), balanced opposite angular directions Φ, or combinations thereof. Furthermore, the radial deflection portions may be formed differently, e.g. having a different shape, cross-sectional profile, or made from other resilient materials.

The various embodiments have been discussed with reference to electron beam lithography processing. However, the principles discussed herein above may equally well be applied to generation of other charged particle beam types (e.g. beams of positive or negative ions), and to other types of charged particle beam processing methods (e.g. to electron beam based target inspection).

The embodiments have been discussed with reference to a collimator electrode stack that is adapted for collimating a beam of charged particles. Electrode stacks that are generally configured for manipulating the path, shape, and kinetic energy of one or more charged particle beams are understood to be also covered.

Sets of clauses are presented directly below, which define aspects and embodiments of electrodes, electrode arrangements, and beam generators. These clause sets may be subject of divisional applications. These clauses also pertain to alternative embodiments that include elements described herein above for which the reference numerals were indicated with primes. Only for brevity and clarity, element reference numbers marked with primes have been omitted from the (non-limiting) reference numbers indicated in the claims and clauses below, but should nevertheless be considered inserted wherever applicable.

Clause Set A a1. Collimator electrode stack (70), comprising:
- at least three collimator electrodes (71-80) for collimating a charged particle beam (54) along an optical axis (A), wherein each collimator electrode comprises an electrode body (81) with an electrode aperture (82) for allowing passage to the charged particle beam, wherein the electrode bodies are spaced along an axial direction (Z) which is substantially parallel with the optical axis, and wherein the electrode apertures are coaxially aligned along the optical axis;
- a plurality of spacing structures (89) provided between each pair of adjacent collimator electrodes and made of an electrically insulating material, for positioning the collimator electrodes at predetermined distances along the axial direction, and wherein each of the collimator electrodes (71-80) is electrically connected to a separate voltage output (151-160).

a2. Collimator electrode stack (70) according to clause a1, wherein each voltage output (151-160) is separately adjustable.

a3. Collimator electrode stack (70) according to clause a1 or a2, wherein the electrode body (81) has a disk shape arranged in a radial-angular plane substantially perpendicular to the axial direction (Z), wherein the electrode aperture (82) is formed by a substantially circular cut-out extending through the electrode body and along the axial direction.

a4. Collimator electrode stack (70) according to any one of clauses a1-a3, wherein the at least three collimator electrodes (71-80) are arranged along the axial direction (Z) as:
- a first collimator electrode (71) provided at an upstream end of the collimator stack;
- a last collimator electrode (80) provided at a downstream end of the collimator stack, and
- at least one intermediate electrode (72-79) provided between the first collimator electrode (71) and the last collimator electrode (80).

a5. Collimator electrode stack (70) according to clause a4, wherein the at least one intermediate electrode (72, 73, 74, 76, 77, 78, 79) has an electrode thicknesses (He) along the axial direction (Z).

a6. Collimator electrode stack (70) according to clause a4 or a5, wherein inter-electrode distances (Hd) between adjacent intermediate electrodes (72, 73, 74, 76, 77, 78, 79) on the one hand, and the intermediate electrode thickness (He) along the axial direction (Z) on the other hand, are bounded by the relation $0.75 \cdot He \leq Hd \leq 1.5 \cdot He$.

a7. Collimator electrode stack (70) according to any one of clauses a4-a6, wherein the first collimator electrode (71) has a first thickness (H1) in a range defined by $1.5 \cdot He \leq H1 \leq 2.5 \cdot He$.

a8. Collimator electrode stack (70) according to any one of clauses a4-a7, wherein the first collimator electrode (71) comprises a first electrode aperture with an axial bore (71a) that diverges along the optical axis (A) in a downstream direction with a smooth curved trajectory toward a radial direction (R) away from the optical axis (A).

a9. Collimator electrode stack (70) according to any one of clauses a4-a8, wherein a last electrode thickness (H10) of a radially inner portion (80a) of the last collimator electrode (80) is in a range defined by $3 \cdot H10 \leq He$.

a10. Collimator electrode stack (70) according to any one of clauses a4-a9, wherein a thickness (H10') of a radially outward portion (80b) of the last collimator electrode (80) is substantially equal to the intermediate electrode thickness (He).

a11. Collimator electrode stack (70) according to any one of clauses a4-a10, wherein the collimator electrodes (71-80) are arranged along the axial direction (Z) such that at least three intermediate electrodes (72-79) are provided between the first collimator electrode (71) and the last collimator electrode (80).

a12. Collimator electrode stack (70) according to clause a11, wherein a middle collimator electrode (75) of the at least three intermediate electrodes (72-79) has a thickness (H5) in a range defined by $1.5 \cdot He \leq H5 \leq 2.5 \cdot He$.

a13. Collimator electrode stack (70) according to any one of clause a1-a12, wherein a relation between a height (Hs) of each spacing structure (89) and a shortest radial distance (ΔR1) between the spacer (89) and the aperture perimeter (82a) of the collimator aperture (82) is defined by $3 \cdot Hs \leq \Delta R1$.

a14. Charged particle beam generator (50), comprising:
- a beam source (52) for generating a charged particle beam (54) along an optical axis (A);
- a collimator electrode stack (70) according to any one of clauses a1-a13; wherein the first collimator electrode (71) is provided at an upstream end of the collimator stack, wherein the electrode apertures (82) of the collimator electrodes (71-80) are aligned along the optical axis, and wherein the beam source is directly fixed onto a top side of the first collimator electrode (71).

a15. Collimator system comprising an electrode stack (70), comprising a plurality of electrodes (71-80) for collimating a charged particle beam (54) along an optical axis (A) of said stack, each collimator electrode comprising an electrode body (81) with an electrode aperture (82) for allowing transmission of the charged particle beam, and an electrical connection for providing the electrode with an electric potential, wherein the electrode bodies are arranged spaced along an axial direction (Z), and wherein the electrode apertures are coaxially aligned along the optical axis;

wherein in use, a middle electrode (75) of the electrode stack (70) is charged to be kept at a highest positive electric potential compared to the other collimator electrodes (71-74, 76-80), and wherein each of the two electrodes preceding the middle electrode (75) in the upstream direction of the electrode stack (70) is configured to be kept at a lower electric potential than its adjacent electrode in the downstream direction;

a16. Collimator system according to clause a15, wherein in use, the last collimator electrode (80) is charged to be kept at a positive electrical potential, and wherein at least one electrode (76-79) located in between the middle electrode (75) and the last electrode (80) is provided with an electric potential lower than the electric potential of the last electrode (80).

a17. Collimator system according to clause a15, wherein at least two electrodes (76-79) are included between the middle electrode (75) and the last electrode (80), the penultimate electrode thereof being charged to obtain a negative electric potential.

a18. Method for operating a charged particle beam generator (50) according to clause a14, wherein the method comprises:
- generating an electron beam (54) with the beam source (52);
- projecting the generated electron beam along an optical axis (A) through the apertures (82) of the collimator electrode stack (70), and
- applying electrical potentials (V1-V10) onto the collimator electrodes (71-80), comprising:
  - keeping a first collimator electrode (71) at ground potential;
  - keeping a middle collimator electrode (75) at a highest positive electric potential, and keeping a last collimator electrode (80) at a low positive electric potential.

a19. Method for operating a beam generator (50) according to clause a18, wherein applying electrical potentials (V1-V10) onto the collimator electrodes (71-80) comprises:
applying an electric potential difference between the middle collimator electrode (75) and an adjacent collimator electrode (74) located directly upstream of the middle collimator electrode, and
applying a further electric potential difference between adjacent collimator electrode (74) and a further adjacent collimator electrode (73) located directly upstream of adjacent collimator electrode;
wherein the further electric potential difference is larger than the electric potential difference.

a20. Method for operating a beam generator (50) according to clause a18 or a19, wherein applying electrical potentials (V1-V10) onto the collimator electrodes (71-80) comprises:
keeping a second collimator electrode (72) upstream of the middle electrode (75) at a negative electric potential.

a21. Method for operating a beam generator (50) according to any one of clauses a18-a19, wherein applying electrical potentials (V1-V10) onto the collimator electrodes (71-80) comprises:
keeping at least one of a penultimate electrode (79) and a two-to-last electrode (78) at a low negative electric potential.

a22. Method for operating a beam generator (50) according to any one of clauses a18-a21, wherein applying electrical potentials (V1-V10) onto the collimator electrodes (71-80) comprises:
keeping at least one of two intermediate collimator electrodes (78, 79) directly preceding the last collimator electrode (80) at a fixed electric potential with a value between −300 Volts and −500 Volts;
keeping the second collimator electrode (72) at a fixed electric potential with a value between −3 kilovolts and −4 kilovolts;
keeping the middle collimator electrode (75) at a fixed electric potential with a value between +20 kilovolts and +30 kilovolts, and
keeping the last collimator electrode (80) at a positive electric potential with a value between +500 Volts and +1100 Volts.

Clause Set C c1. Collimator electrode, comprising an electrode body (81), which preferably disk shape or an oblate ring shape, wherein the electrode body is provided with a central electrode aperture (82), wherein the electrode body defines an electrode height (He) between two opposite main surfaces, and wherein the electrode body accommodates a cooling conduit (105) inside the electrode body for transferring a cooling liquid (102).

c2. Collimator electrode according to clause c1, wherein cooling conduit (105) is formed as a conduit tube (105), preferably made of titanium.

Using a conduit tube as a cooling conduit allows for suitable selection of material of the conduit. In particular, a relatively strong material that is thermally and electrically conductive may be used, while the collimator electrode may be made of a different material.

c3. Collimator electrode according to clause c1 or c2, wherein the electrode body (81) is made of aluminum.

Aluminum is a light-weight material, which facilitates construction and serviceability of the collimator stack. Aluminum also has good electrical conductance and non-magnetic properties, which is favorable in charged particle beam manipulation applications. Aluminum furthermore has good thermal conductance, which helps in dissipating thermal energy caused by charged particle scattering and collisions.

c4. Collimator electrode according to any one of clauses c1-c3, wherein the cooling conduit (105) comprises a first opening (103) for connection to a liquid supply structure (117) and a second opening (104) for connection to a liquid discharge structure (118).

c5. Collimator electrode according to clause c4, wherein the first opening (103) and the second opening (104) are located in a side surface (85) of the first and second collimator electrodes.

Locating the first opening (103) and the second opening (104) of the cooling conduit (105) in the side surface (85) of a ring-shaped electrode body (81) aids to keep the space between the distinct collimator electrodes (71-80) free from potentially interfering structures. In particular, since the cooling liquid supply and/or removal occurs from the side of the electrode stack (70) (i.e. predominantly along the radial and/or angular direction), the liquid supply structure (117) and/or liquid discharge structure (118) do not need to take up space between the collimator electrodes.

c6. Collimator electrode according to clause c5, wherein the first opening (103) and the second opening (104) of each collimator electrode are located close to each other in the side surface (85) of the collimator electrode.

Locating the first and second opening proximate to each other in the side surface (85) of the collimator electrode allows for placement of both the cooling liquid supply structure and the cooling liquid discharge structure at the same side of the collimator system, which provides more space for other components to be placed alongside the collimator system if needed.

c7. Collimator electrode according to any one of clauses c4-c6, wherein the cooling conduit (105) interconnects the first opening (103) and the second opening (104) via a conduit trajectory (105a-105d) provided inside the electrode body (81) and around the aperture (82).

By allowing the cooling conduit to have a trajectory through the electrode around the aperture, the electrode is cooled more homogeneously.

c8. Collimator electrode according to clause c5 or c6, wherein the aperture (82) has circular symmetry with respect to an optical axis (A) of the collimator electrode, and wherein the cooling conduit (105) comprises a substantially circular portion (105a) extending around the aperture (82) and two substantially straight end portions (105b) for connecting the circular portion with the first opening (103) and the second opening (104).

This arrangement is particularly favorable if the aperture of the collimator electrode is a circular aperture. In such case, the substantially circular portion of the cooling conduit around the aperture is located at the same distance from the side wall of the aperture over its trajectory, which results in more homogeneous cooling of the center portion of the collimator electrode. The electrode aperture (82) may be formed by a substantially circular through hole in the electrode body (81) and extending along the axial direction (Z).

c9. Collimator electrode according to clause c8, wherein a relation between a diameter (Ø) of the electrode aperture (82) on the one hand, and a radial distance (ΔR2) between a perimeter (82a) of the electrode aperture (82) and the circular portion (105a) of the cooling conduit (105) on the other hand, is defined by $3 \cdot \Delta R2 \geq \emptyset$.

c10. Collimator electrode according to any one of clauses c2-c9, wherein the conduit tube (105) is integrated inside the electrode body (81) of the collimator electrode.

Integrating the conduit tube (105) in the collimator electrode improves the cooling efficiency. Furthermore, the risk of a creation of local electric field concentrations at the location of the conduit tube is significantly reduced.

c11. Collimator electrode according to any one of clauses c2-c10, wherein the electrode body (81) is at least partly composed of cast material, in particular cast aluminum, and wherein the conduit tube (105) is included in said cast material.

Preferably, the conduit tube (105) is made of titanium. Titanium is a strong metal exhibiting low magnetic field response and having a relatively high melting temperature. Titanium conduits can be efficiently formed inside an aluminum electrode body by casting the electrode body around the conduit (due to the much lower melting temperature of aluminum).

c12. Collimator electrode according to any one of clauses c2-c9, wherein a top surface (83) of the electrode body (81) is provided with a recess (106) having a shape corresponding to the conduit tube (105), and wherein the conduit tube is located inside the recess.

A collimator electrode with a suitably formed recess (106) for placement of a conduit tube (105) therein is relatively easy to manufacture.

c13. Collimator electrode stack (70) according to clause c12, wherein the conduit tube (105) is attached inside the recess (106) to the collimator electrode (71-80) by means of a thermally conducting adhesive material (107).

Attaching the conduit tube to the collimator electrode by means of a thermally conducting adhesive material improves the thermal conductivity, and thus results in more effective cooling.

c14. Collimator electrode according to any one of clauses c2-c13, wherein the conduit tube (105) comprises:
- a lower gutter portion (105c) with rectangular surfaces defined on an outside and a curved gutter defined on an inside, and
- an upper lid portion (105d) for sealing the curved gutter defined on the inside of the lower gutter portion, thereby forming a flow channel for the cooling liquid (102).

c15. Collimator electrode according to any one of clauses c2-c14, comprising at least two electrode support portions (86) and electrode support members (87) along an outward electrode perimeter (85) of the electrode body (81), wherein each electrode support member interconnects the electrode perimeter with a corresponding electrode support portion (86), thereby defining a thermal expansion space (88) between the electrode support portion and the outer electrode perimeter, and wherein the electrode support members (87) are adapted to jointly support a weight of the electrode body (81) in the axial direction (Z).

c16. Collimator electrode according to clause c15, wherein the electrode support member (87) comprises a movable elongated arm (87a-87c) that is connected at a first end to the outer electrode perimeter (85) and connected with a second end to the electrode support portion (86).

c17. Collimator electrode according to clause c16, wherein the movable elongated arm (87a-87c) comprises an arm narrowing (87b-87c) that allows flexing of the corresponding electrode support portion (86) with respect to the electrode body (81) in a radial-angular plane, while preventing flexing of the corresponding electrode support portion (86) with respect to the electrode body (81) in the axial direction (Z).

c18. Collimator electrode according to any one of clauses c1-c17, wherein the cooling conduit (105) is connected to an electrically insulating conduit member provided outside an outer perimeter (85) of the electrode body (81).

c19. Collimator electrode stack (70) for use in a charged particle beam generator (50), wherein the collimator electrode stack comprises:
- a plurality of collimator electrodes (71-80) according to any one of the clauses c1-c18, and adapted for collimating a charged particle beam (54), wherein at least a first collimator electrode and a second collimator electrode are each provided with a cooling conduit (105) for transferring a cooling liquid (102), the cooling conduit comprising a first opening (103) for connection to a liquid supply structure (117) and a second opening (104) for connection to a liquid discharge structure (118), and wherein the collimator electrode stack comprises a connecting conduit (110) arranged to establish a liquid connection between the second opening (104) of the first collimator electrode and the first opening (103) of the second collimator electrode.

The stacked arrangement of collimator electrodes (71-80) enables construction of a beam generator with a relatively low weight. The cooling conduits (105) in the first and second collimator electrodes allow transportation of the cooling liquid (102) along the electrodes, to exchange thermal energy between the electrode bodies and the cooling liquid (102). The cooling liquid (102) can thus absorb excessive heat from the collimator electrodes, and permit regulation of thermally induced deformation of the collimator electrodes.

The connecting conduit (110) allows establishment of liquid connections between the electrodes. The connecting conduit (110) may for example be formed by intermediate tubular elements. The connecting conduit (110) interconnects the first and second openings (103-104) of respective collimator electrodes, and hence establishes a serial liquid connection between these collimator electrodes. A serial liquid connection of several collimator electrodes within the stack enables simultaneous cooling, while only needing a single cooling liquid supply structure (117) and cooling liquid discharge structure (118) for supply and removal of the cooling liquid (102).

In designing a actively cooled collimator electrode stack (70), it is a challenge to maximize the efficiency of heat transfer from the electrodes to the cooling liquid (102), while simultaneously minimizing electrode charge losses via the cooling liquid (102).

The proposed multi-electrode collimator stack (70) is configured for generating a gradual (stepwise) variation of the electric potential distribution along the axial direction (Z). By serially interconnecting the first and second openings (103-104) of the respective electrodes in the proposed collimator electrode stack arrangement, the electric potential differences applied between adjacent electrodes during operation are expected to be smaller than for a collimator electrode stack with a parallel electrode cooling arrangement (i.e. a cooling arrangement that comprises distinct connections of cooling supply and discharge conduits to each electrode). As a result of the relatively smaller electric potential difference experienced by the cooling liquid (102) across the connecting conduit (110) between two electrodes, the loss of electrode charge via dissipation current through the cooling liquid (102) is expected to be smaller.

Two, several, or even all of the collimator electrodes in the collimator electrode stack (70) may be formed as electrodes, provided with connecting conduits (110) between respective first and second openings (103-104). A serial cooling liquid configuration with connecting conduits (11) between the collimator electrodes is relatively easy to construct an/or to reconfigure, which greatly facilitates, maintenance, optimization testing, and adaptation to changing operational requirements.

c20. Collimator electrode stack (70) according to clause c17, wherein the electrode bodies (81) of the first collimator electrode and the second collimator electrode are coaxially arranged with the electrode apertures (82) aligned along an optical axis (A) of the collimator electrode stack.

c21. Collimator electrode stack (70) according to clause c20, wherein the second collimator electrode is located upstream of the first collimator electrode, as viewed along an optical axis (A).

In many charged particle beam collimator implementations, the collimator electrodes located downstream are more susceptible to the impingement of backscattered and/or secondary electrons, which results in a higher heat load. By supplying the cooling liquid to the first electrode located downstream before transferring the cooling liquid to the second electrode located upstream, the lower temperature of the cooling liquid at the first electrode will allow more excess heat to be absorbed, yielding a better overall heat exchange efficiency between the heated electrodes and the cooling liquid.

Preferably, the first collimator electrode and the second collimator electrode are directly adjacent collimator electrodes in the collimator electrode stack.

c22. Collimator electrode stack (70) according to any one of clauses c18-c21, wherein the connecting conduit (110) is formed as an intermediate tubular element (110) comprising a first substantially straight portion (111) facing away from the first opening (103), a second substantially straight portion (112) facing away from the second opening (104), and a substantially curved portion (113) connecting the first straight portion with the second straight portion.

An intermediate tubular element comprising the two straight portions and an intermediate curved portion reduces the risk of buckling of the intermediate tubular element, and more securely guarantees continuous transfer of cooling liquid through the intermediate tubular element.

c23. Collimator electrode stack (70) according to any one of clauses c18-c22, wherein at least part of the connecting conduit (110) is made of an electrically insulating material, preferably aluminum oxide.

Aluminum oxide is a preferred material because it has a relatively low mass density, has a low bulk electrical conductivity, and easy to use for manufacturing purposes.

c24. Collimator electrode stack (70) according to any one of clauses c18-c23 wherein the connecting conduit (110) is provided with at least one bellows structure (114) that is adapted for accommodating differential thermal deformations between the first collimator electrode and the second collimator electrode.

c25. Collimator electrode stack (70) according to any one of clauses c18-c24, wherein the cooling liquid (102) is ultra-pure water or oil with a low electrical conductivity.

c26. Collimator electrode stack (70) according to any one of clauses c18-c25, wherein the electrode body (81) is provided with a top surface (83) facing the charged particle source (52), and a bottom surface (84) facing away from the charged particle source, the bottom surface and top surface being interconnected via a side surface (85) defining an outer electrode perimeter.

c27. Collimator electrode stack (70) according to any one of clauses c18-c26, wherein the collimator electrodes are mutually displaced by spacing structures (89) made of an electrically insulating material.

c28. Collimator electrode stack (70) according to clause c27, wherein the spacing structures (89) provide an inter-electrode spacing (Hd) between the collimator electrodes along the axial direction (Z).

c29. A charged particle beam generator (50) for use in a charged particle lithography system (10), the charged particle beam generator comprising:
- a charged particle source (52) for generating a charged particle beam (54), and
- a collimator electrode stack (70) according to any one of clauses c18-c28.

c30. Charged particle lithography system (10) for exposing a target (31), the system comprising:
- a charged particle beam generator (50) for generating a charged particle beam (54) according to clause c29;
- an aperture array (58) for forming a plurality of beamlets from the charged particle beam, and
- a beamlet projector (66) for projecting the beamlets onto a surface of the target.

c31. Charged particle lithography system (10) according to clause c30, further comprising a beamlet modulator (56, 60) for patterning the beamlets to form modulated beamlets, and wherein the beamlet projector (66) is arranged for projecting the modulated beamlets onto the surface of the target (31).

c32. Charged particle lithography system (10) according to clause c30 or c31, comprising a liquid supply structure (117) for transferring cooling liquid from a cooling liquid pump (116) towards the collimator system, and a liquid discharge structure (118) for transferring cooling liquid away from the collimator system back to the cooling liquid pump (116).

c33. Charged particle lithography system (10) according to clause c32, comprising the cooling liquid pump (116) connected to at least one of the liquid supply structure (117) and the liquid discharge structure (118), for circulating the cooling liquid through the collimator electrode stack (70).

c34. Charged particle lithography system (10) according to clause c33, wherein the cooling liquid pump (116) is adapted for re-circulating the cooling liquid (102) from the liquid discharge structure (118) towards the liquid supply structure (117) in a closed loop, and wherein the charged particle lithography system is adapted for removing thermal energy from the cooling liquid emanating from the liquid discharge structure (118) by means of a heat exchanger unit.

c35. Charged particle lithography system (10) according to clause c34, comprising a filter arrangement adapted for removing electrically conductive particles from re-circulating cooling liquid (102) during operation.

Clause Set D d1. Charged particle beam generator (50) for use in a charged particle lithography system (10), the charged particle beam generator comprising:
- a charged particle source (52) for generating a charged particle beam (54) along an optical axis (A);
- a collimator electrode stack (70) for collimating the charged particle beam, wherein the electrode stack spans a collimator height (Hc) along the optical axis;
- a generator vacuum chamber (51) for accommodating the collimator electrode stack (70) and the charged particle source (52), and
- at least one vacuum pump system (122, 123) provided inside the generator vacuum chamber (51) at a distance (ΔRp) from an outer perimeter (85) of the collimator electrode stack, wherein the at least one vacuum pump system spans an effective pumping surface (122a, 123a) that is directed substantially parallel with the optical axis (A), and wherein the effective pumping surface has a surface height (Hp) that spans at least part of the collimator height (Hc)

d2. Charged particle beam generator (50) according to clause d1, wherein the surface height (Hp) of the effective pumping surface (122a, 123a) has a value that is minimally in the order of a diameter (0c) of the collimator electrode stack (70).

d3. Charged particle beam generator (50) according to any one of clauses d1-d2, wherein the vacuum pump system comprises at least four getters (122, 123) arranged mutually adjacent and substantially parallel with the axial direction (Z), and extending with respective effective pumping surfaces (122a, 123a) along a largest part of the collimator height (Hc).

d4. Charged particle beam generator (50) according to any one of clauses d1-d3, wherein the distance (ΔRp) between the vacuum pump system (122, 123) and the outer perimeter (85) of the collimator electrode stack (70), is larger than a typical inter-electrode distance (Hd) between two adjacent electrodes in the collimator electrode stack.

d5. Charged particle beam generator (50) according to any one of clauses d1-d4, comprising a pump support structure (124) arranged inside the generator vacuum chamber (51) and configured for carrying pump units (122, 123) of the vacuum pump system by means of selectively releasable connections.

d6. Charged particle beam generator (50) according to any one of clauses d1-d5, wherein the collimator stack (70) comprises three support columns (90) extending over three distinct angular column ranges (ΔΦ1, ΔΦ2, ΔΦ3) along an outer collimator perimeter, and wherein the effective pumping surface (122a, 123a) of the pumping system (122, 123) spans an angular pump range (ΔΦp) that has no overlap with either one of the three angular column ranges.

d7. Charged particle beam generator (50) according to clause d6, wherein the angular pump range (ΔΦp) spanned by the effective pumping surface (122a, 123a) largely coincides with an angular range defined between two support columns (90).

d8. Charged particle beam generator (50) according to any one of clauses d1-d7, wherein the collimator stack (70) comprises a sequence of collimator electrodes (71-80), each collimator electrode comprising an electrode body (81) for sustaining an electrical potential and provided with an aperture (82) for permitting passage to the charged particle beam (54).

d9. Charged particle beam generator (50) according to clause d8, wherein the collimator electrodes (71-80) comprise, arranged along the axial direction (Z):
  a first collimator electrode (71) provided at an upstream end of the collimator stack;
  a last collimator electrode (80) provided at a downstream end of the collimator stack;
  at least one intermediate electrode (72, 73, 74, 76, 77, 78, 79) provided between the first collimator electrode and last collimator electrode.

d10. Charged particle beam generator (50) according to clause d9, wherein the at least one intermediate collimator electrode has a thickness (He), and wherein the collimator electrodes are mutually spaced at predetermined distances (Hd) along the optical axis (A), wherein the predetermined mutual distance (Hd) is bounded by $0.75 \cdot He \leq Hd \leq 1.5 \cdot He$.

d11. Charged particle beam generator (50) according to any one of clauses d8-d10, wherein at least one collimator electrode (71, 72, 73, 74, 76, 77, 78, 79, 80) comprises three support portions (86) extending over three respective angular ranges (ΔΦ1, ΔΦ2, ΔΦ3) along the outer electrode perimeter (85), wherein each support portion (86) is configured to accommodate a least one spacing structure (89) for mutually spacing an adjacent electrode body (81) at the predetermined distance (Hd).

d12. Charged particle beam generator (50) according to clause d11, wherein the support portions (86) of adjacent collimator electrodes and interposed spacing structures (89) are coaxially aligned to define a support column (90) along the axial direction (Z) at one of the three angular column ranges (ΔΦ1, ΔΦ2, ΔΦ3).

d13. Charged particle beam generator (50) according to any one of clauses d8-d12, wherein at least two of the collimator electrodes comprise cooling conduits (105) for transferring a cooling liquid (102), each cooling conduit comprising a first opening (103) for connection to a liquid supply structure and a second opening (104) for connection to a liquid discharge structure, and wherein the electrode stack comprises an intermediate tubular element (110) for connecting the second opening of a first collimator electrode with the first opening of a second collimator electrode.

d14. Charged particle beam generator (50) according to clause d13, wherein the collimator electrodes (71-80) comprise a ring-shaped electrode body (81, 81') provided with a top surface (83) facing the charged particle source (52), and a bottom surface (84) facing away from the charged particle source, the bottom surface and top surface being connected to each other via a side surface (85) defining an outer electrode perimeter, and wherein the first opening (103) and the second opening (104) are located in the side surface.

d15. Charged particle beam generator (50) according to clause d14, wherein the first opening (103) and the second opening (104) are located at the same side surface of the collimator electrode (71-80).

d16. Charged particle beam generator (50) according to any one of clauses d13-d15, wherein the intermediate tubular element (110) is provided at the outer electrode perimeter (85), spanning a tube angular range (MA) along the outer electrode perimeter (85), and wherein the angular pump range (ΔΦp) of the pumping aperture (122a, 123a) has no overlap with the conduit angular range.

d17. Charged particle beam generator (50) according to any one of clauses d13-d16, wherein the cooling conduit (105) is formed by a conduit tube that is integrated within the collimator electrode body (81).

Having conduit tubes integrated within the collimator electrode body will increase the lateral space (i.e. mean free path) available for free molecules moving in the collimator stack to travel radially outward and be removed e.g. absorbed by getter pumps positioned radially outward at a distance from the collimator stack.

d18. Charged particle beam generator (50) according to any one of clauses d1-d17, comprising a beam source vacuum chamber (53) accommodated within the beam generator chamber (51), wherein the beam source (52) is accommodated within a beam source vacuum chamber, and wherein the collimator stack (70) is positioned outside the beam source vacuum chamber.

d19. Charged particle beam generator (50) according to clause d18, wherein the beam source chamber (53) encloses at least one source vacuum pump unit (120), for creating a pressure differential between the beam source chamber and the beam generator chamber (51).

The differential pressure ultra-low vacuum near the beam source (52) helps to improve its radiation emission efficiency and prolong its effective radiation lifetime.

d20. Charged particle beam generator (50) according to any one clauses d1-d19, wherein the beam generator is formed as a beam generator module that is insertable into and removable from a carrier frame (42) provided inside a vacuum chamber (30) of a charged particle lithography system (10), wherein the beam generator comprises a beam generator chamber (51) enclosing the beam source (52) and the collimator stack (70).

d21. Charged particle beam generator (50), in particular according to any one of clauses d1-d20, wherein the collimator electrode stack (70) comprises a stack support system (93-101c) for supporting the collimator electrode stack with respect to an external reference frame (42), wherein the generator vacuum chamber (51) comprises chamber apertures (132) adapted for passing through protruding support portions (95, 99-100b) of the stack support system (93-101c), to allow the protruding support portions to establish a separate support interface with the external reference frame (42) on an outside of the generator vacuum chamber (51).

d22. Charged particle beam generator (50) according to clause d21, comprising gaskets (98) wherein each gasket is adapted to seal a void between a respective chamber aperture (132) and a corresponding protruding support portion (95, 99-100b), so as to establish a vacuum barrier between the outside and the inside of the generator vacuum chamber.

d23. Charged particle beam generator (50), in particular according to any one of clauses d1-d22, comprising a source vacuum chamber (53) accommodating the beam source (52) on an inside thereof, wherein the charged particle source (52) and the source vacuum chamber (53) are provided upstream of the collimator electrode stack and inside the generator vacuum chamber (51), and wherein the a stack support system (93-101c) comprises source chamber support members (101-101c) for directly supporting the source vacuum chamber (53) onto the stack support system (93-96b).

d24. Charged particle beam generator (50) according to any one of clauses 1-23, wherein a surface width of the effective pumping surface (122a, 123a) has a value that is minimally in the order of the diameter (0c) of the collimator electrode stack (70).

d25. A charged particle lithography system (10) for exposing a target (31), the system comprising:
  a charged particle beam generator (50) for generating a charged particle beam (54) according to any one of clauses d1-d24;
  an aperture array (58) for forming a plurality of beamlets from the charged particle beam; and
  a beamlet projector (66) for projecting the beamlets onto a surface of the target.

Clause Set E e1. Collimator electrode stack (70), comprising:
  a plurality of stacked collimator electrodes (71-80) for collimating a charged particle beam (54) along an optical axis (A);
wherein each collimator electrode comprises an electrode body (81) with an electrode aperture (82) for permitting passage of the charged particle beam, wherein the electrode bodies are mutually spaced along an axial direction (Z) that is substantially parallel with the optical axis, and wherein the electrode apertures are coaxially aligned along the optical axis, and
  a stack support system (93-101c) for supporting the collimator electrode stack with respect to an external reference frame (42), and connected to a lateral region (75a, 92b, 97) of the collimator electrode stack.

e2. Collimator electrode stack (70) according to clause 1, wherein the stack support system (93-96b) comprises stack support members (93-101c) that are distributed along an outer perimeter of the collimator electrode stack (70), the perimeter extending in an angular direction (Φ) around the optical axis (A), wherein the stack support members cooperate to support the collimator electrode stack with respect to the external reference frame (42).

e3. Collimator electrode stack (70) according to clause e2, wherein each stack support member (93-101c) comprises:

a joint (94-94b) for connecting the stack support member to the lateral region (75a, 92b, 97) of the collimator electrode stack;
  a base (95, 99, 99a-99b) for connecting the stack support member to the external reference frame (42), and
  at least one flexible radial deflection portion (96a-96b, 100a-100b) for allowing the joint to displace with respect to the base in the radial direction (R).

e4. Collimator electrode stack (70) according to clause e2 or e3, wherein each stack support member comprises a stack support leg (93'-101c') that is connected to a middle collimator electrode (75) located in the middle region (75a) of the collimator electrode stack.

e5. Collimator electrode stack (70") according to clause e2 or e3, comprising ten stacked collimator electrodes (71"-80"), wherein each stack support member has a stack support leg (93"-101c") comprising:
  a leg member (93a") that is connected to a second or a third collimator electrode (72"-73"), and
  a further leg member (93c") that is connected to an eighth or a ninth collimator electrode (78"-79").

e6. Collimator electrode stack (70) according to any one of clauses e1-e5, wherein the support system (93-101c) is connected to a middle region (75a) of the collimator electrode stack.

e7. Collimator electrode stack (70) according to any one of clauses e1-e6, comprising spacing structures (89) of an electrically insulating material, for positioning the collimator electrodes (71-80) at predetermined mutual distances along the axial direction (Z).

e8. Collimator electrode stack (70) according to clause e7, wherein at least one of the collimator electrodes (71-80) comprises three support portions (86) along an outer electrode perimeter (85), wherein each support portion is configured to accommodate at least one spacing structure (89).

e9. Collimator electrode stack (70) according to clause e8, wherein the electrode support portions (86) of adjacent collimator electrodes (71-80) and interposed spacing structures (89) are axially aligned to define a support column (90) parallel with the axial direction (Z).

e10. Collimator electrode stack (70) according to clause e9, wherein each support column (90) is provided with a clamping member (91-91c), for holding the support portions (86) and interposed spacing structures (89) together.

e11. Collimator electrode stack (70) according to clause e10, wherein the support portions (86) and the spacing structures (89) of a corresponding support column (90) comprise axially aligned through holes that accommodate the clamping member (91-91c), and wherein the clamping member is pre-tensioned to exert compressional forces on the support column (90) parallel with the axial direction (Z).

e12. Collimator electrode stack (70) according to any one of clauses e8-e11, wherein the collimator electrodes (71-80) comprise three radially movable electrode support members (87) along the outer electrode perimeter (85), wherein each electrode support member interconnects the outer electrode perimeter with a corresponding electrode support portion (86), thereby defining a thermal expansion space (88) between the electrode support portion and the outer electrode perimeter.

e13. Collimator electrode stack (70) according to clause e12, wherein the electrode support member (87) comprises a radially movable elongated arm that is connected at a first end to the outer electrode perimeter (85) and connected with a second end to the electrode support portion (86), wherein the arm extends substantially along the angular direction (1), and wherein the thermal expansion space (88) forms a slot that also extends substantially along the angular direction.

e14. Charged particle beam generator (50), comprising:
- a beam source (52) for generating a charged particle beam (54) along an optical axis (A);
- a collimator electrode stack (70) with stack support system (93-101c) according to any one of clauses e1-e13;
wherein the first collimator electrode (71) is provided at an upstream end of the collimator stack, wherein the beam source is provided upstream of the first collimator electrode, and wherein the beam source (52) and the electrode apertures (82) of the collimator electrodes (71-80) are coaxially aligned along the optical axis.

e15. Charged particle beam generator (50) according to clause e14, comprising:
- a generator vacuum chamber (51) for accommodating the collimator electrode stack (70) on an inside thereof, wherein the generator vacuum chamber comprises chamber apertures (132) adapted for passing through protruding support portions (95, 99-100b) of the stack support system (93-101c), to allow the protruding support portions to establish a separate support interface with the external reference frame (42) outside of the generator vacuum chamber, and
- gaskets (98), wherein each gasket is adapted to seal a void between a respective chamber aperture (132) and a corresponding protruding support portion (95, 99-100b).

e16. Charged particle beam generator (50) according to any one of clauses e12-e15, formed as a beam generator module, wherein the beam generator vacuum chamber (51) is insertable into, supportable by, and removable from a carrier frame (42) provided inside a vacuum chamber (30) of a charged particle lithography system (10).

e17. Charged particle beam generator (50) according to any one of clauses e12-e16, comprising:
- a source chamber (53) located on an upstream end of the collimator electrode stack (70), and adapted for accommodating the beam source (52) on an inside thereof, and
- source chamber support members (101-101c) for directly supporting the source chamber (53) onto the stack support system (93-96b).

e18. Charged particle lithography system (10) for processing a target (31), the system comprising:
- a vacuum chamber (30) enclosing a carrier frame (42);
- a charged particle beam generator (50) according to any one of clauses e12-e17, wherein the beam generator is accommodated by the carrier frame;
wherein the collimator stack (70) comprises three stack support members (93-101c), each support member being connected to a middle region (75a) of the collimator stack at a first end, and to the carrier frame at a second end, so as to support the collimator stack on the carrier frame.

The invention claimed is:

1. An electrode stack, in particular a collimator electrode stack, wherein the electrode stack comprises:
a plurality of stacked electrodes for manipulating a charged particle beam along an optical axis, wherein each electrode comprises an electrode body with an electrode aperture for permitting passage of the charged particle beam, wherein the electrode bodies are mutually spaced along an axial direction that is substantially parallel with the optical axis, and wherein the electrode apertures are coaxially aligned along the optical axis, and
spacing structures essentially consisting of an electrically insulating material, and arranged between each pair of adjacent electrodes for positioning the electrodes at predetermined mutual distances along the axial direction;
wherein a first electrode and a second electrode each comprise an electrode body with one or more support portions, wherein each support portion is configured to accommodate at least one spacing structure,
wherein the electrode stack is formed with at least one clamping member that is configured for holding together the respective support portions of the first and second electrodes, with the at least one spacing structure located in between.

2. The electrode stack according to claim 1, wherein the electrode body of the first electrode and/or the second electrode has a disk shape or an oblate ring shape.

3. The electrode stack according to claim 1, wherein at least one of the first and second electrodes comprises three support portions along a radially outward perimeter of the electrode body, wherein the three support portions jointly support a weight of the electrode body.

4. The electrode stack according to claim 3, wherein the support potions are sufficiently rigid to prevent deflection of the support portions with respect to the electrode body along the axial direction.

5. The electrode stack according to claim 3, wherein the electrode support portions of adjacent electrodes and interposed spacing structures are axially aligned to define a support column parallel with the axial direction.

6. The electrode stack according to claim 5, wherein each support column is connected with a respective clamping member, for holding the support portions and interposed spacing structures together.

7. The electrode stack according to claim 3, wherein a support portion is connected in a radially movable manner to the electrode body of the corresponding electrode by means of an electrode support member.

8. The electrode stack according to claim 7, wherein the electrode support member is provided along the outward electrode perimeter, thereby defining a thermal expansion space between the electrode support portion and the outer electrode perimeter.

9. The electrode stack according to claim 7, wherein the electrode support member comprises a movable elongated arm that is connected at a first end to the outer electrode perimeter and connected with a second end to a corresponding electrode support portion.

10. The electrode stack according to claim 9, wherein the movable elongated arm comprises an flexible arm narrowing that allows deflection of the corresponding electrode support portion with respect to the electrode body in a radial-angular plane, while preventing deflection of the corresponding electrode support portion with respect to the electrode body in the axial direction.

11. The electrode stack according to claim 10, wherein the flexible arm narrowing is included on at least one end portion of the movable elongated arm.

12. The electrode stack according to claim 9, wherein the movable elongated arm extends substantially along the angular direction, and wherein the thermal expansion space forms a slot that extends substantially along the angular direction.

13. The electrode stack according to claim 5, wherein the support portions and the spacing structures of a corresponding support column comprise axially aligned through holes, wherein the through holes jointly define a void that accommodates a corresponding clamping member, and wherein the clamping member is pre-tensioned to exert a compression force on the support column parallel with the axial direction.

14. The electrode stack according to claim 13, wherein an inner diameter of a through hole in a support portion and/or a spacing structure is substantially larger than an outer diameter of the clamping member.

15. The electrode stack according to claim 14, wherein a difference in the inner diameter of the through hole and the outer diameter of the clamping member leaves open a radial void for providing electrical insulation between the clamping member on the one hand and the support portion and/or spacing structure on the other hand.

16. The electrode stack according to claim 1, wherein, viewed along the axial direction, a thickness of the electrode body of the first electrode and/or the second electrode is in the order of magnitude of an inter-electrode distance between the first electrode and the second electrode.

17. A charged particle beam generator, comprising:
   a beam source for generating a charged particle beam along an optical axis;
   an electrode stack with stack support system according to claim 1;
wherein the first electrode is provided at an upstream end of the electrode stack and the beam source is provided upstream of the first electrode, and
wherein the beam source and the electrode apertures of the electrodes are coaxially aligned along the optical axis.

18. The charged particle beam generator according to claim 17, adapted for operation as a particle beam collimator, in particular wherein the charged particle beam generator is configured for applying a electric potential difference between a first electrode and a second electrode, and a further electric potential difference between the second electrode and a third electrode, wherein the further electric potential difference is larger than the electric potential difference.

19. The charged particle beam generator according to claim 18, wherein at least the third electrode is provided with a cooling conduit for conducting a cooling liquid.

20. The charged particle beam generator according to claim 17, comprising:
   a generator vacuum chamber for accommodating the electrode stack, wherein the generator vacuum chamber comprises chamber apertures adapted for passing through protruding support portions of the stack support system, to allow the protruding support portions to establish a separate support connection outside of the generator vacuum chamber and with respect to the external reference frame, and
   gaskets, wherein each gasket is adapted to seal a void between a respective chamber aperture and a corresponding protruding support portion.

21. The charged particle beam generator according to claim 17, formed as a beam generator module, wherein the beam generator vacuum chamber is insertable into, supportable by, and removable from a carrier frame provided inside a vacuum chamber of a charged particle lithography system.

22. The charged particle beam generator according to claim 17, comprising:
   a source chamber located on an upstream end of the electrode stack, and adapted for accommodating the beam source on an inside thereof, and
   source chamber support members for directly supporting the source chamber onto the stack support system.

23. A charged particle lithography system for processing a target, the system comprising:
   a vacuum chamber enclosing a carrier frame;
   a charged particle beam generator according to claim 17, wherein the beam generator is accommodated by the carrier frame;
   wherein the electrode stack comprises three stack support members, each support member being connected to a middle region of the electrode stack at a first end, and to the carrier frame at a second end, so as to support the electrode stack on the carrier frame.

24. An electrode, adapted for use in a charged particle beam generator, and comprising a ring-shaped electrode body provided with a top surface, and a bottom surface, the bottom surface and top surface being connected to each other via a side surface defining an outer electrode perimeter, wherein the electrode comprises three support portions along the electrode perimeter, wherein each support portion is configured to accommodate a least one spacing structure.

25. The electrode according to claim 24, comprising three radially movable electrode support arms along the outer electrode perimeter, wherein each electrode support arm interconnects the outer electrode perimeter with a corresponding electrode support portion, thereby defining a thermal expansion space between the electrode support portion and the outer electrode perimeter.

26. The electrode according to claim 25, wherein the electrode support arm comprises a radially elongated body that is connected at one end to the outer electrode perimeter and connected with an opposite end to the electrode support portion, wherein the elongated body extends substantially along in the angular direction, and wherein the thermal expansion space forms a slot that also extends substantially along the angular direction.

27. The electrode according to claim 24, comprising a monolithic electrode body, preferably of cast metal, more preferably essentially consisting of aluminum.

* * * * *